US008291151B2

(12) United States Patent
Sinclair

(10) Patent No.: US 8,291,151 B2
(45) Date of Patent: Oct. 16, 2012

(54) ENHANCED HOST INTERFACE

(75) Inventor: Alan Welsh Sinclair, Falkirk (GB)

(73) Assignee: SanDisk Technologies Inc., Plano, TX (US)

(*) Notice: Subject to any disclaimer, the term of this patent is extended or adjusted under 35 U.S.C. 154(b) by 1302 days.

(21) Appl. No.: 11/316,578

(22) Filed: Dec. 21, 2005

(65) Prior Publication Data

US 2007/0033327 A1 Feb. 8, 2007

Related U.S. Application Data

(60) Provisional application No. 60/705,388, filed on Aug. 3, 2005.

(51) Int. Cl.
  G06F 12/00 (2006.01)
  G06F 12/08 (2006.01)
  G06F 3/00 (2006.01)
(52) U.S. Cl. .................. 711/103; 707/999.1; 710/11
(58) Field of Classification Search .................. 711/103; 707/999.1; 710/11
  See application file for complete search history.

(56) References Cited

U.S. PATENT DOCUMENTS

| 4,800,520 A | 1/1989 | Iijima |
| 4,802,117 A | 1/1989 | Chrosny et al. |
| 5,226,155 A | 7/1993 | Iijima |
| 5,369,754 A | 11/1994 | Fandrich et al. |
| 5,388,083 A | 2/1995 | Assar et al. |
| 5,404,485 A | 4/1995 | Ban |
| 5,570,315 A | 10/1996 | Tanaka et al. |
| 5,592,662 A | 1/1997 | Sawada et al. |
| 5,592,669 A | 1/1997 | Robinson et al. |
| 5,602,987 A | 2/1997 | Harari et al. |
| 5,619,690 A | 4/1997 | Matsunami et al. |
| 5,634,050 A | 5/1997 | Krueger et al. |
| 5,754,817 A | 5/1998 | Wells et al. |
| 5,774,397 A | 6/1998 | Endoh et al. |
| 5,787,445 A | 7/1998 | Daberko |
| 5,799,168 A | 8/1998 | Ban |
| 5,809,558 A | 9/1998 | Matthews et al. |
| 5,832,493 A | 11/1998 | Marshall et al. |
| 5,867,641 A | 2/1999 | Jenett |
| 5,896,393 A | 4/1999 | Yard et al. |
| 5,907,854 A | 5/1999 | Kerns |
| 5,928,347 A | 7/1999 | Jones |
| 5,933,846 A | 8/1999 | Endo |

(Continued)

FOREIGN PATENT DOCUMENTS

DE  10234971 A1  2/2004

(Continued)

OTHER PUBLICATIONS

Russel Redman, "Microsoft Envisions PC as Digital Media Control Center", Channel Web, May 7, 2003, http://www.crn.com/it-channel/18830157.*

(Continued)

*Primary Examiner* — Michael Alsip
(74) *Attorney, Agent, or Firm* — Weaver Austin Villeneuve & Sampson LLP

(57) ABSTRACT

A memory system that is compatible with hosts using different protocols includes protocol adapters for the different protocols. Protocol adapters allow a common backend system to be used for data that is provided in different formats. A protocol adapter generates responses to a host and generates commands for a backend as appropriate.

20 Claims, 11 Drawing Sheets

U.S. PATENT DOCUMENTS

| | | | |
|---|---|---|---|
| 5,937,425 A | 8/1999 | Ban |
| 5,966,720 A | 10/1999 | Itoh et al. |
| 5,987,478 A | 11/1999 | See et al. |
| 6,014,724 A | 1/2000 | Jenett |
| 6,021,415 A | 2/2000 | Cannon et al. |
| 6,046,935 A | 4/2000 | Takeuchi et al. |
| 6,069,827 A | 5/2000 | Sinclair |
| 6,148,354 A | 11/2000 | Ban et al. |
| 6,216,204 B1 | 4/2001 | Thiriet |
| 6,256,690 B1 | 7/2001 | Carper |
| 6,275,804 B1 | 8/2001 | Carl et al. |
| 6,279,069 B1 | 8/2001 | Robinson et al. |
| 6,373,746 B1 | 4/2002 | Takeuchi et al. |
| 6,385,690 B1 | 5/2002 | Iida et al. |
| 6,412,040 B2 | 6/2002 | Hasbun et al. |
| 6,426,893 B1 | 7/2002 | Conley et al. |
| 6,446,140 B1 | 9/2002 | Nozu |
| 6,456,528 B1 | 9/2002 | Chen |
| 6,467,021 B1 | 10/2002 | Sinclair |
| 6,480,935 B1 | 11/2002 | Carper et al. |
| 6,484,937 B1 | 11/2002 | Devaux et al. |
| 6,490,649 B2 | 12/2002 | Sinclair |
| 6,522,580 B2 | 2/2003 | Chen et al. |
| 6,535,949 B1 | 3/2003 | Parker |
| 6,547,150 B1 | 4/2003 | Deo et al. |
| 6,567,307 B1 | 5/2003 | Estakhri |
| 6,598,114 B2 | 7/2003 | Funakoshi |
| 6,604,168 B2 | 8/2003 | Ogawa |
| 6,643,188 B2 | 11/2003 | Tanaka et al. |
| 6,668,336 B2 | 12/2003 | Lasser |
| 6,763,424 B2 | 7/2004 | Conley |
| 6,766,432 B2 | 7/2004 | Saltz |
| 6,771,536 B2 | 8/2004 | Li et al. |
| 6,772,955 B2 | 8/2004 | Yoshimoto et al. |
| 6,779,063 B2 | 8/2004 | Yamamoto |
| 6,781,877 B2 | 8/2004 | Cernea et al. |
| 6,859,856 B2 * | 2/2005 | Piau et al. ............ 711/103 |
| 6,865,659 B2 | 3/2005 | Montemayor |
| 6,883,114 B2 | 4/2005 | Lasser |
| 6,886,083 B2 | 4/2005 | Murakami |
| 6,901,457 B1 | 5/2005 | Toombs et al. |
| 6,925,007 B2 | 8/2005 | Harari et al. |
| 7,035,949 B2 | 4/2006 | Bychkov et al. |
| 7,035,993 B2 | 4/2006 | Tai et al. |
| 7,092,911 B2 | 8/2006 | Yokota et al. |
| 7,111,085 B2 | 9/2006 | Estakhri et al. |
| 2002/0188592 A1 | 12/2002 | Leonhardt et al. ............ 707/1 |
| 2003/0229753 A1 | 12/2003 | Hwang |
| 2004/0049627 A1 | 3/2004 | Piau et al. |
| 2004/0073727 A1 | 4/2004 | Moran et al. |
| 2004/0109062 A1 | 6/2004 | Yamaya ............ 348/207.1 |
| 2004/0157638 A1 | 8/2004 | Moran et al. |
| 2005/0060447 A1 | 3/2005 | Tanaka ............ 710/62 |
| 2005/0141312 A1 | 6/2005 | Sinclair et al. |
| 2005/0141313 A1 | 6/2005 | Gorobets et al. |
| 2005/0144357 A1 | 6/2005 | Sinclair |
| 2005/0144358 A1 | 6/2005 | Conley et al. |
| 2005/0144360 A1 | 6/2005 | Bennett et al. |
| 2005/0144363 A1 | 6/2005 | Sinclair |
| 2005/0144365 A1 | 6/2005 | Gorobets et al. |
| 2005/0144367 A1 | 6/2005 | Sinclair |
| 2005/0166087 A1 | 7/2005 | Gorobets |
| 2006/0020744 A1 | 1/2006 | Sinclair et al. |
| 2006/0020745 A1 | 1/2006 | Conley et al. |
| 2006/0031593 A1 | 2/2006 | Sinclair |
| 2006/0109349 A1 | 5/2006 | Takashima ............ 348/207.1 |
| 2006/0155920 A1 | 7/2006 | Smith et al. |
| 2006/0155921 A1 | 7/2006 | Gorobets et al. |
| 2006/0155922 A1 | 7/2006 | Gorobets et al. |
| 2006/0161728 A1 | 7/2006 | Bennett et al. |
| 2006/0168395 A1 | 7/2006 | Deng et al. |
| 2006/0184718 A1 | 8/2006 | Sinclair et al. |
| 2006/0184719 A1 | 8/2006 | Sinclair |
| 2006/0184720 A1 | 8/2006 | Sinclair et al. |
| 2006/0184722 A1 | 8/2006 | Sinclair |
| 2006/0184723 A1 | 8/2006 | Sinclair et al. |

FOREIGN PATENT DOCUMENTS

| | | |
|---|---|---|
| EP | 1 199 874 A | 4/2002 |
| EP | 1 100 001 B1 | 8/2003 |
| EP | 1 571 557 A | 9/2005 |
| GB | 2 204 973 A | 11/1988 |
| JP | 62-283496 A | 12/1987 |
| JP | 2002-251310 A | 9/2002 |
| JP | 2005-501317 | 1/2005 |
| WO | WO 00/49488 A1 | 8/2000 |
| WO | WO 02/101535 | 12/2002 |
| WO | WO 2004/012027 | 2/2004 |
| WO | WO 2004/040455 | 5/2004 |
| WO | WO 2004/046937 | 6/2004 |
| WO | WO 2005/001701 A1 | 1/2006 |

OTHER PUBLICATIONS

Microsoft Computer Dictionary Fifth Edition, Microsoft Press, 2002, p. 64 and 470.*

U.S. Appl. No. 11/196,869, filed Aug. 3, 2005.

U.S. Appl. No. 11/302,764, filed Dec. 13, 2005.

Intel AP-686 Application Note, "Flash File System Selection Guide," Dec. 1998, 18 pages.

Ban, Amir, "Local Flash Disks: Two Architectures Compared," M-Systems Flash Disk Pioneers, White Paper, Rev. 1.0, Aug. 2001, 9 pages.

Ban, Amir, "Inside Flash File Systems—Part I", IC Card Systems & Design, Jul./Aug. 1993, pp. 15-16, 18.

Ban, Amir, "Inside Flash File Systems—Part II", IC Card Systems & Design, Sep./Oct. 1993, pp. 21-24.

ISO/IEC, International Standard, "Information technology—Identification cards—Integrated circuit(s) with contacts—Part 4: Interindustry commands for interchange," ISO/IEC 7816-4, First Edition, Sep. 1, 1995, 46 pages.

Kolowsky et al., "Introduction to MTP: Media Transfer Protocol," Cypress Semiconductor.

Rankl, Wolfgang et al., "Smart Card Handbook," Third Edition, Translated by Kenneth Cox, John Wiley & Sons, Ltd., 2004, pp. 52-93, 233-369, and 435-490.

International Searching Authority (EPO), "Notification of Transmittal of the International Search Report and the Written Opinion of the International Searching Authority, or the Declaration," mailed in corresponding International Application No. PCT/US2006/030342 on May 18, 2007, 14 pages.

http://searchstorage.techtartet.com/sDefinition/0,,sid5_gci836184,00.html, Memory Card, Jun. 28, 2002, 4 pages.

USPTO, Final Office Action mailed on Mar. 20, 2008 in related U.S. Appl. No. 11/316,577, 23 pages.

USPTO, Office Action mailed on Jul. 29, 2008 in related U.S. Appl. No. 11/316,577.

"The Authoritative Dictionary of IEEE Standards Terms" Seventh Edition, IEEE Press, 2000, p. 107.

USPTO, Final Office Action mailed on Feb. 2, 2009 in related U.S. Appl. No. 11/316,577.

First Office Action for South Korean Application No. 2008-7005053 mailed Jan. 25, 2010.

First Office Action for Chinese Application No. 200680034856.4 mailed Dec. 25, 2009.

Second Office Action for Chinese Application No. 200680034856.4 mailed Sep. 22, 2011.

First Office Action for Japanese Application No. 2008-525201 mailed Nov. 24, 2010.

Final Office Action for Japanese Application No. 2008-525201 mailed Nov. 1, 2011.

* cited by examiner

ENHANCED HOST INTERFACE

CROSS-REFERENCE TO RELATED APPLICATIONS

This application claims the benefit of U.S. Provisional Application No. 60/705,388, entitled "Direct Data File Storage in Flash Memories," filed on Aug. 3, 2005. This application is also related to U.S. patent application Ser. Nos. 11/060,174, 11/060,248 and 11/060,249, all filed on Feb. 16, 2005; and to U.S. patent application Ser. No. 11/196,869, entitled, "Interfacing Systems Operating Through a Logical Address Space and on a Direct Data File Basis," filed on Aug. 3, 2005. This application is also related to U.S. patent application Ser. No. 11/316,577, entitled, "Enhanced Host Interfacing Methods," filed on the same day as the present application.

BACKGROUND

This application relates to the operation of re-programmable non-volatile memory systems such as semiconductor flash memory, and, more specifically, to the management of the interface between a host device and the memory. All patents, patent applications, articles and other publications, documents and things referenced herein (including all applications referenced above under "Cross-reference to related applications) are hereby incorporated herein by this reference in their entirety for all purposes.

In an early generation of commercial flash memory systems, a rectangular array of memory cells were divided into a large number of groups of cells that each stored the amount of data of a standard disk drive sector, namely 512 bytes. An additional amount of data, such as 16 bytes, are also usually included in each group to store an error correction code (ECC) and possibly other overhead data relating to the user data and/or to the memory cell group in which it is stored. The memory cells in each such group are the minimum number of memory cells that are erasable together. That is, the erase unit is effectively the number of memory cells that store one data sector and any overhead data that is included. Examples of this type of memory system are described in U.S. Pat. Nos. 5,602,987 and 6,426,893. It is a characteristic of flash memory that the memory cells need to be erased prior to re-programming them with data.

Flash memory systems are most commonly provided in the form of a memory card or flash drive that is removably connected with a variety of hosts such as a personal computer, a camera or the like, but may also be embedded within such host systems. When writing data to the memory, the host typically assigns unique logical addresses to sectors, clusters or other units of data within a continuous virtual address space of the memory system. Like a disk operating system (DOS), the host writes data to, and reads data from, addresses within the logical address space of the memory system. A controller within the memory system translates logical addresses received from the host into physical addresses within the memory array, where the data are actually stored, and then keeps track of these address translations. The data storage capacity of the memory system is at least as large as the amount of data that is addressable over the entire logical address space defined for the memory system.

In later generations of flash memory systems, the size of the erase unit was increased to a block of enough memory cells to store multiple sectors of data. Even though host systems with which the memory systems are connected may program and read data in small minimum units such as sectors, a large number of sectors are stored in a single erase unit of the flash memory. It is common for some sectors of data within a block to become obsolete as the host updates or replaces logical sectors of data. Since the entire block must be erased before any data stored in the block can be overwritten, new or updated data are typically stored in another block that has been erased and has remaining capacity for the data. This process leaves the original block with obsolete data that take valuable space within the memory. But that block cannot be erased if there are any valid data remaining in it.

Therefore, in order to better utilize the memory's storage capacity, it is common to consolidate or collect valid partial block amounts of data by copying them into an erased block so that the block(s) from which these data are copied may then be erased and their entire storage capacity reused. It is also desirable to copy the data in order to group data sectors within a block in the order of their logical addresses since this increases the speed of reading the data and transferring the read data to the host. If such data copying occurs too frequently, the operating performance of the memory system can be degraded. This particularly affects operation of memory systems where the storage capacity of the memory is little more than the amount of data addressable by the host through the logical address space of the system, a typical case. In this case, data consolidation or collection may be required before a host programming command can be executed. The programming time is then increased.

The sizes of the blocks are increasing in successive generations of memory systems in order to increase the number of bits of data that may be stored in a given semiconductor area. Blocks storing 256 data sectors and more are becoming common. Additionally, two, four or more blocks of different arrays or sub-arrays are often logically linked together into metablocks in order to increase the degree of parallelism in data programming and reading. Along with such large capacity operating units come challenges in operating them efficiently.

As new innovations allow greater memory capacity and speed, it is generally desirable to provide products that use such innovations but are still compatible with products that do not use such innovations. This means that new products can take advantage of technical innovations but still be backward compatible so that they can be used with products using older technologies. Such backward compatibility is particularly important for portable products that may be used in a variety of configurations with a variety of different technologies. One example of such a portable product is a removable flash memory card.

SUMMARY OF THE INVENTION

A memory system includes an interface layer that is in communication with a host and a backend that stores data in a memory array. Between the interface layer and the backend a translation layer converts data and commands received by the interface layer according to different protocols used by hosts into a format that is intelligible to the backend. Thus, the translation layer allows a common backend to be used with a variety of hosts using a variety of protocols. This is especially useful for memory systems in removable memory cards. The translation layer contains one or more protocol adapters. A protocol adapter receives communication (commands and data) from a host according to the protocol used by the host and in response converts the data and commands for the backend. A protocol adapter may also generate signals to the host where such signals are part of the host protocol.

A memory system includes an object protocol adapter that converts data and commands sent according to an object protocol into a format that is compatible with file based storage in a nonvolatile memory. In particular, an object protocol adapter receives metadata concerning an object before receiving the object. The size of the object is included in the metadata. The object protocol adapter determines when the entire object has been received by comparing the amount of data received with the size indicated by the metadata information. When the object protocol adapter determines that the entire object has been received, it generates a response to the host and generates an end of file indicator to the backend of the memory system so that the file is closed by the backend. This allows the backend to schedule the file for garbage collection and thereby allows the file data to be more efficiently stored and managed.

A memory system includes an LBA protocol adapter that converts data and commands according to an LBA protocol into data and commands that are compatible with file based storage in a nonvolatile memory. In one example, data that are received having logical addresses assigned by a host from a logical address space defined for the memory system are mapped to logical files. Logical files are then treated by the backend in the same way as other files. Logical files generally occupy an entire metablock so that they do not share a metablock with other data. However, the same blocks may be used for logical files at one time and for other files at other times so that the memory array does not have a hard partition between different types of files.

A memory system includes a file protocol adapter that converts data and commands according to a file protocol into data and commands that are compatible with file based storage in a nonvolatile memory. Where the backend uses the same protocol as the host (e.g. both use a Direct Data File protocol) no translation may be necessary. However, where a different file protocol is used by the host, the file protocol adapter makes the appropriate translation.

In some cases the memory system may be in communication with more than one host using more than one protocol adapter. In such cases, the translation layer may select one protocol adapter at a time to communicate with the backend. In some cases, the translation layer may arbitrate between different hosts by selecting different protocol adapters alternately to provide interleaved access to the backend.

The interface layer includes logical interfaces that are compatible with multiple hosts. In some cases there may also be separate physical interfaces for connection with corresponding interfaces on host devices. However, this is not necessary and in some cases a single physical interface, such as a USB connector, is provided and is used by all logical interfaces. The interface layer and translation layer functions may be performed by dedicated circuitry or may be performed by firmware on a controller. This may be a memory controller that manages the memory array. The memory array may be a NAND memory array and may be formed on one or more semiconductor chips. The memory system may be contained in a removable card that is connected to different hosts at different times.

The backend system may manage data as files that in some cases correspond to host files (though in some cases, there is no one-to-one correspondence with host files). One example of a file based backend system is a Direct Data File backend described in U.S. patent application Ser. Nos. 11/060,174, 11/060,248 and 11/060,249 and Provisional Patent Application No. 60/705,388.

BRIEF DESCRIPTION OF THE DRAWINGS

FIG. 8 illustrates in a different manner than FIG. 7 a common prior art logical address interface between a host and a re-programmable memory system;

DESCRIPTION OF EXEMPLARY EMBODIMENTS

Flash Memory General Description

A current flash memory system and a typical operation with host devices are described with respect to FIGS. 1-8. It is in such a system that the various aspects of the present invention may be implemented. A host system 1 of FIG. 1 stores data into and retrieves data from a flash memory 2. Although the flash memory can be embedded within the host, the memory 2 is illustrated to be in the more popular form of a card that is removably connected to the host through mating parts 3 and 4 of a mechanical and electrical connector. There are currently many different flash memory cards that are commercially available, examples being the CompactFlash (CF), the MultiMediaCard (MMC), Secure Digital (SD), miniSD, Memory Stick, SmartMedia and TransFlash cards.

Although each of these cards has a unique mechanical and/or electrical interface according to its standardized specifications, the flash memory included in each is very similar. These cards are all available from SanDisk Corporation, assignee of the present application. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them.

Host systems that use such memory cards and flash drives are many and varied. They include personal computers (PCs), laptop and other portable computers, cellular telephones, personal digital assistants (PDAs), digital still cameras, digital movie cameras and portable audio players. The host typically includes a built-in receptacle for one or more types of memory cards or flash drives but some require adapters into which a memory card is plugged.

Figure 1:
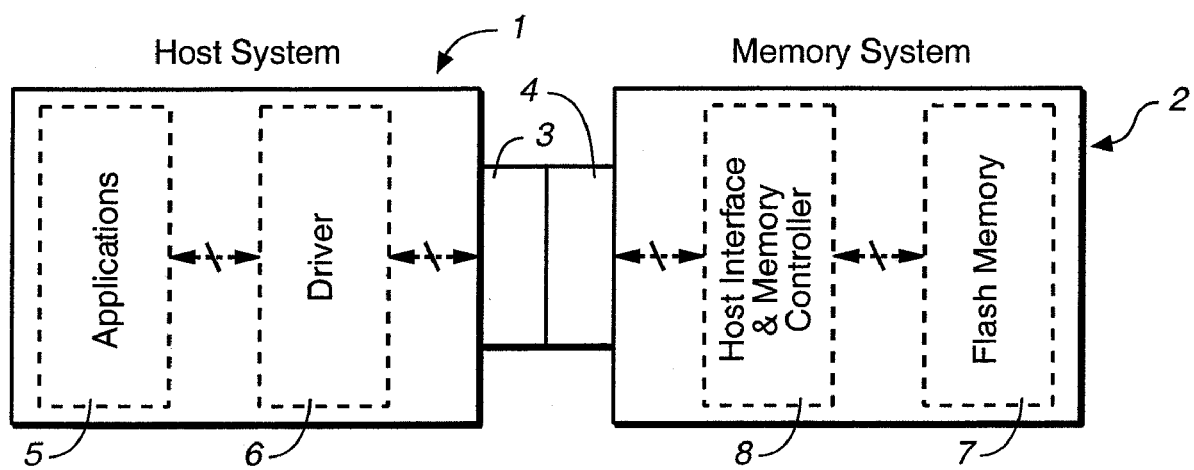
FIG. 1 schematically illustrates a host and a connected non-volatile memory system as currently implemented.

The host system 1 of FIG. 1 may be viewed as having two major parts, insofar as the memory 2 is concerned, made up of a combination of circuitry and software. They are an applications portion 5 and a driver portion 6 that interfaces with the memory 2. In a personal computer, for example, the applications portion 5 can include a processor running word processing, graphics, control or other popular application software. In a camera, cellular telephone or other host system that is primarily dedicated to performing a single set of functions, the applications portion 5 includes the software that operates the camera to take and store pictures, the cellular telephone to make and receive calls, and the like.

The memory system 2 of FIG. 1 includes flash memory 7, and circuits 8 that both interface with the host to which the card is connected for passing data back and forth and control the memory 7. The controller 8 typically converts between logical addresses of data used by the host 1 and physical addresses of the memory 7 during data programming and reading.

Figure 2:
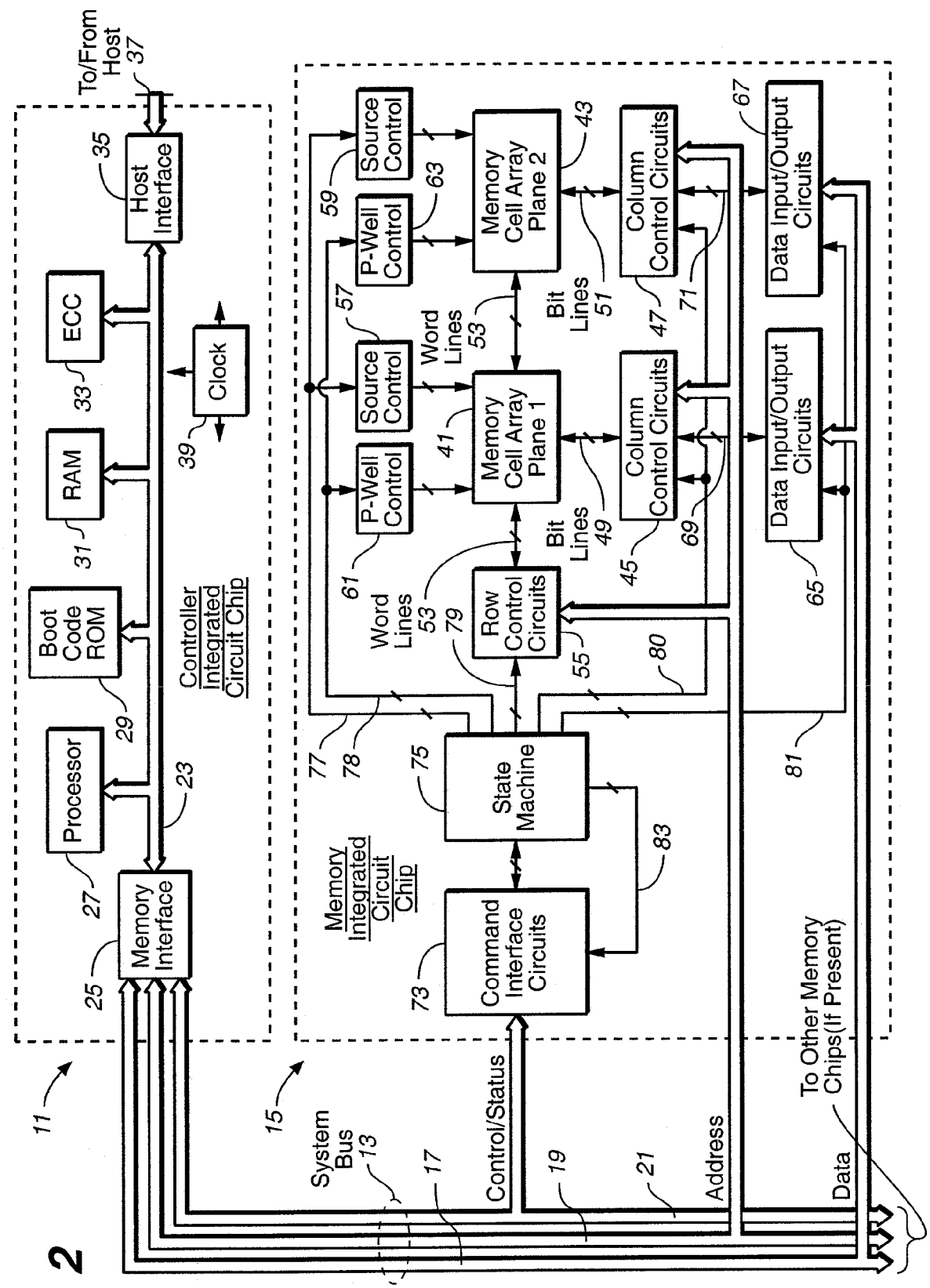
FIG. 2 is a block diagram of an example flash memory system for use as the non-volatile memory of FIG. 1.

Referring to FIG. 2, circuitry of a typical flash memory system that may be used as the non-volatile memory 2 of FIG. 1 is described. The system controller is usually implemented on a single integrated circuit chip 11 that is connected in parallel with one or more integrated circuit memory chips over a system bus 13, a single such memory chip 15 being shown in FIG. 2. The particular bus 13 that is illustrated includes a separate set of conductors 17 to carry data, a set 19 for memory addresses and a set 21 for control and status signals. Alternatively, a single set of conductors may be time shared between these three functions. Further, other configurations of system buses can be employed, such as a ring bus that is described in U.S. patent application Ser. No. 10/915,039, filed Aug. 9, 2004, entitled "Ring Bus Structure and It's Use in Flash Memory Systems."

A typical controller chip 11 has its own internal bus 23 that interfaces with the system bus 13 through interface circuits 25. The primary functions normally connected to the bus are a processor 27 (such as a microprocessor or micro-controller), a read-only-memory (ROM) 29 containing code to initialize ("boot") the system, random-access-memory (RAM) 31 used primarily to buffer data being transferred between the memory and a host, and circuits 33 that calculate and check an error correction code (ECC) for data passing through the controller between the memory and the host. The controller bus 23 interfaces with a host system through circuits 35, which, in the case of the system of FIG. 2 being contained within a memory card, is done through external contacts 37 of the card that are part of the connector 4. A clock 39 is connected with and utilized by each of the other components of the controller 11.

The memory chip 15, as well as any other connected with the system bus 13, typically contains an array of memory cells organized into multiple sub-arrays or planes, two such planes 41 and 43 being illustrated for simplicity but more, such as four or eight such planes, may instead be used. Alternatively, the memory cell array of the chip 15 may not be divided into planes. When so divided however, each plane has its own column control circuits 45 and 47 that are operable independently of each other. The circuits 45 and 47 receive addresses of their respective memory cell array from the address portion 19 of the system bus 13, and decode them to address a specific one or more of respective bit lines 49 and 51. The word lines 53 are addressed through row control circuits 55 in response to addresses received on the address bus 19. Source voltage control circuits 57 and 59 are also connected with the respective planes, as are p-well voltage control circuits 61 and 63. If the memory chip 15 has a single array of memory cells, and if two or more such chips exist in the system, the array of each chip may be operated similarly to a plane or sub-array within the multi-plane chip described above.

Data are transferred into and out of the planes 41 and 43 through respective data input/output circuits 65 and 67 that are connected with the data portion 17 of the system bus 13. The circuits 65 and 67 provide for both programming data into the memory cells and for reading data from the memory cells of their respective planes, through lines 69 and 71 connected to the planes through respective column control circuits 45 and 47.

Although the controller 11 controls the operation of the memory chip 15 to program data, read data, erase and attend to various housekeeping matters, each memory chip also contains some controlling circuitry that executes commands from the controller 11 to perform such functions. Interface circuits 73 are connected to the control and status portion 21 of the system bus 13. Commands from the controller are provided to a state machine 75 that then provides specific control of other circuits in order to execute these commands. Control lines 77-81 connect the state machine 75 with these other circuits as shown in FIG. 2. Status information from the state machine 75 is communicated over lines 83 to the interface 73 for transmission to the controller 11 over the bus portion 21.

A NAND architecture of the memory cell arrays 41 and 43 is currently preferred, although other architectures, such as NOR, can also be used instead. Examples of NAND flash memories and their operation as part of a memory system may be had by reference to U.S. Pat. Nos. 5,570,315, 5,774,397, 6,046,935, 6,373,746, 6,456,528, 6,522,580, 6,771,536 and 6,781,877 and United States Patent Application Publication No. 2003/0147278.

Figure 3:
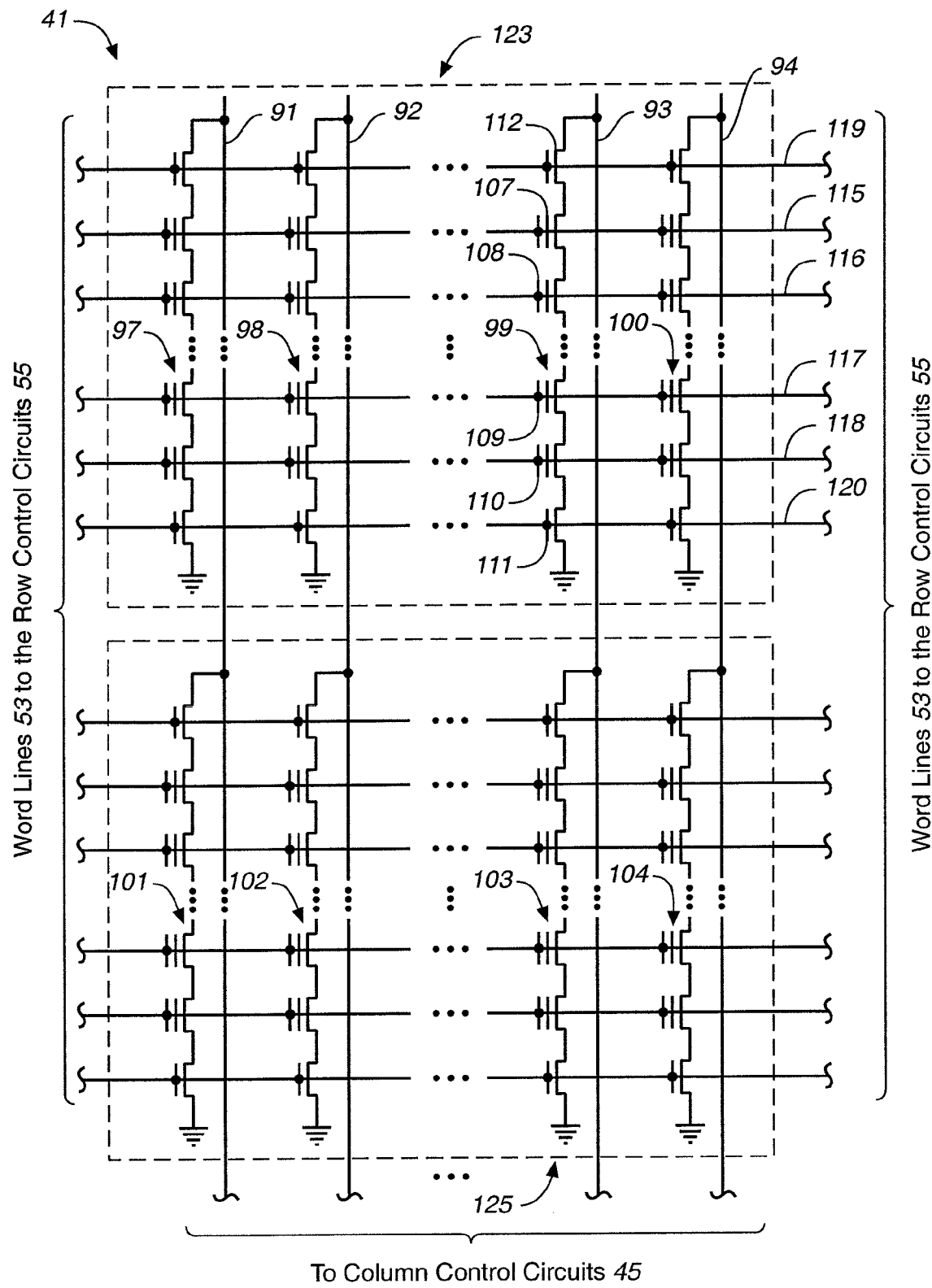
FIG. 3 is a representative circuit diagram of a memory cell array that may be used in the system of FIG. 2.

An example NAND array is illustrated by the circuit diagram of FIG. 3, which is a portion of the memory cell array 41 of the memory system of FIG. 2. A large number of global bit lines are provided, only four such lines 91-94 being shown in FIG. 2 for simplicity of explanation. A number of series connected memory cell strings 97-104 are connected between one of these bit lines and a reference potential. Using the memory cell string 99 as representative, a plurality of charge storage memory cells 107-110 are connected in series with select transistors 111 and 112 at either end of the string. When the select transistors of a string are rendered conductive, the string is connected between its bit line and the reference potential. One memory cell within that string is then programmed or read at a time.

Word lines 115-118 of FIG. 3 individually extend across the charge storage element of one memory cell in each of a number of strings of memory cells, and gates 119 and 120 control the states of the select transistors at each end of the strings. The memory cell strings that share common word and control gate lines 115-120 are made to form a block 123 of memory cells that are erased together. This block of cells contains the minimum number of cells that are physically erasable at one time. One row of memory cells, those along one of the word lines 115-118, are programmed at a time. Typically, the rows of a NAND array are programmed in a prescribed order, in this case beginning with the row along the word line 118 closest to the end of the strings connected to ground or another common potential. The row of memory cells along the word line 117 is programmed next, and so on, throughout the block 123. The row along the word line 115 is programmed last.

A second block 125 is similar, its strings of memory cells being connected to the same global bit lines as the strings in the first block 123 but having a different set of word and control gate lines. The word and control gate lines are driven to their proper operating voltages by the row control circuits 55. If there is more than one plane or sub-array in the system, such as planes 1 and 2 of FIG. 2, one memory architecture uses common word lines extending between them. There can alternatively be more than two planes or sub-arrays that share common word lines. In other memory architectures, the word lines of individual planes or sub-arrays are separately driven.

As described in several of the NAND patents and published application referenced above, the memory system may be operated to store more than two detectable levels of charge in each charge storage element or region, thereby to store more than one bit of data in each. The charge storage elements of the memory cells are most commonly conductive floating gates but may alternatively be non-conductive dielectric charge trapping material, as described in United States Patent Application Publication No. 2003/0109093.

Figure 4:
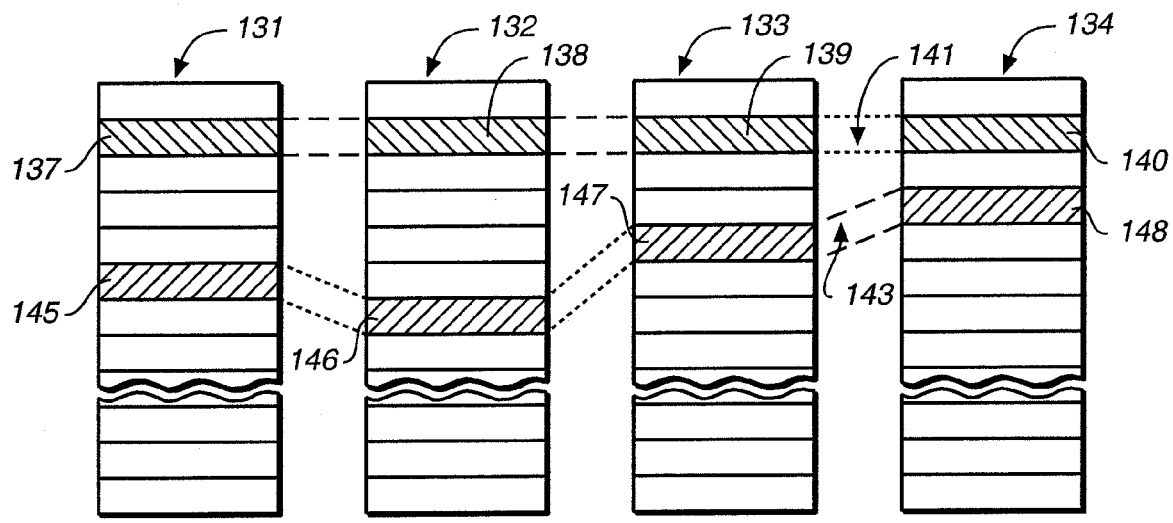
FIG. 4 illustrates an example physical memory organization of the system of FIG. 2.

FIG. 4 conceptually illustrates an organization of the flash memory cell array 7 (FIG. 1) that is used as an example in further descriptions below. Four planes or sub-arrays 131-134 of memory cells may be on a single integrated memory cell chip, on two chips (two of the planes on each chip) or on four separate chips. The specific arrangement is not important to the discussion below. Of course, other numbers of planes, such as 1, 2, 8, 16 or more may exist in a system. The planes are individually divided into blocks of memory cells shown in FIG. 4 by rectangles, such as blocks 137, 138, 139 and 140, located in respective planes 131-134. There can be dozens or hundreds of blocks in each plane. As mentioned above, the block of memory cells is the unit of erase, the smallest number of memory cells that are physically erasable together. For increased parallelism, however, the blocks are operated in larger metablock units. One block from each plane is logically linked together to form a metablock. The four blocks 137-140 are shown to form one metablock 141. All of the cells within a metablock are typically erased together. The blocks used to form a metablock need not be restricted to the same relative locations within their respective planes, as is shown in a second metablock 143 made up of blocks 145-148. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation.

Figure 5:
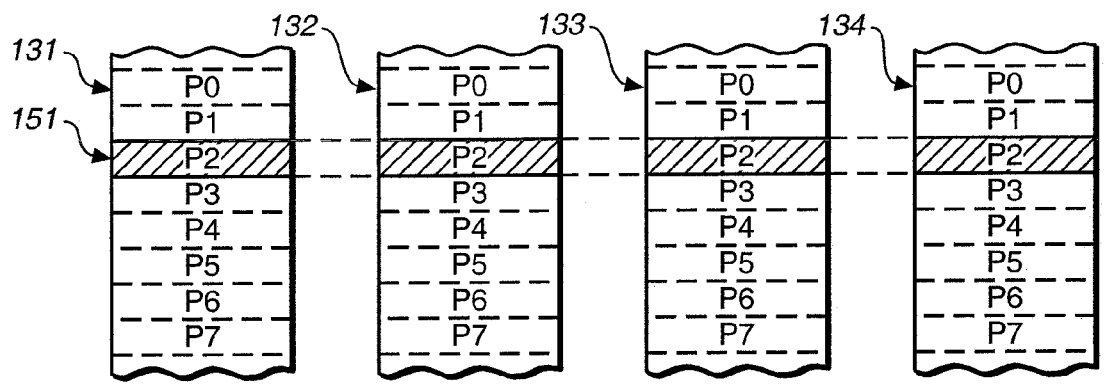
FIG. 5 shows an expanded view of a portion of the physical memory of FIG. 4.

The individual blocks are in turn divided for operational purposes into pages of memory cells, as illustrated in FIG. 5. The memory cells of each of the blocks 131-134, for example, are each divided into eight pages P0-P7. Alternatively, there may be 16, 32 or more pages of memory cells within each block. The page is the unit of data programming and reading within a block, containing the minimum amount of data that are programmed at one time. In, the NAND architecture of FIG. 3, a page is formed of memory cells along a word line within a block. However, in order to increase the memory system operational parallelism, such pages within two or more blocks may be logically linked into metapages. A metapage 151 is illustrated in FIG. 5, being formed of one physical page from each of the four blocks 131-134. The metapage 151, for example, includes the page P2 in of each of the four blocks but the pages of a metapage need not necessarily have the same relative position within each of the blocks. Although it is preferable to program and read the maximum amount of data in parallel across all four planes, for high system performance, the memory system can also be operated to form metapages of any or all of one, two or three pages in separate blocks in different planes. This allows the programming and reading operations to adaptively match the amount of data that may be conveniently handled in parallel and reduces the occasions when part of a metapage remains unprogrammed with data.

Most memory management techniques used to manage data using single pages and single blocks at a time can be applied to metapages and metablocks also. Similarly, techniques using metapages and metablocks can generally also be applied to single blocks and single pages. Generally, examples given using pages and blocks will be understood to be applicable to metapages and metablocks. Similarly, examples given with respect to metapages and metablocks will be understood to be generally applicable to pages and blocks.

A metapage formed of physical pages of multiple planes, as illustrated in FIG. 5, contains memory cells along word line rows of those multiple planes. Rather than programming all of the cells in one word line row at the same time, they are more commonly alternately programmed in two or more interleaved groups, each group storing a page of data (in a single block) or a metapage of data (across multiple blocks). By programming alternate memory cells at one time, a unit of peripheral circuits including data registers and a sense amplifier need not be provided for each bit line but rather are time-shared between adjacent bit lines. This economizes on the amount of substrate space required for the peripheral circuits and allows the memory cells to be packed with an increased density along the rows. Otherwise, it is preferable to simultaneously program every cell along a row in order to maximize the parallelism available from a given memory system.

With reference to FIG. 3, the simultaneous programming of data into every other memory cell along a row is most conveniently accomplished by providing two rows of select transistors (not shown) along at least one end of the NAND strings, instead of the single row that is shown. The select transistors of one row then connect every other string within a block to their respective bit lines in response to one control signal, and the select transistors of the other row connect intervening every other string to their respective bit lines in response to another control signal. Two pages of data are therefore written into each row of memory cells.

Figure 6:
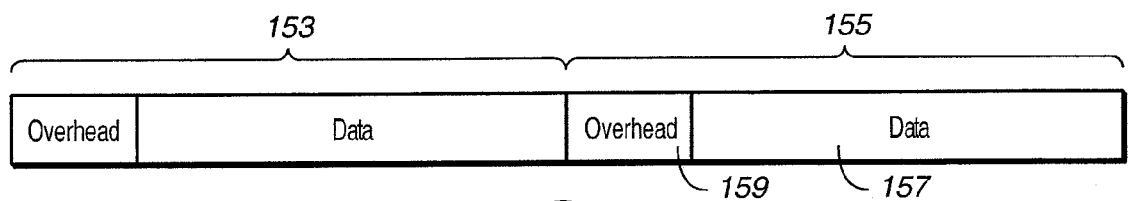
FIG. 6 shows a further expanded view of a portion of the physical memory of FIGS. 4 and 5.

The amount of data in each logical page is typically an integer number of one or more sectors of data, each sector containing 512 bytes of data, by convention. FIG. 6 shows a logical data page of two sectors 153 and 155 of data of a page or metapage. Each sector usually contains a portion 157 of 512 bytes of user or system data being stored and another number of bytes 159 for overhead data related either to the data in the portion 157 or to the physical page or block in which it is stored. The number of bytes of overhead data is typically 16 bytes, making the total 528 bytes for each of the sectors 153 and 155. The overhead portion 159 may contain an ECC calculated from the data portion 157 during programming, its logical address, an experience count of the number of times the block has been erased and re-programmed, one or more control flags, operating voltage levels, and/or the like, plus an ECC calculated from such overhead data 159. Alternatively, the overhead data 159, or a portion of it, may be stored in different pages in other blocks.

As the parallelism of memories increases, data storage capacity of the metablock increases and the size of the data page and metapage also increase as a result. The data page may then contain more than two sectors of data. With two sectors in a data page, and two data pages per metapage, there are four sectors in a metapage. Each metapage thus stores 2048 bytes of data. This is a high degree of parallelism, and can be, increased even further as the number of memory cells in the rows is increased. For this reason, the width of flash memories is being extended in order to increase the amount of data in a page and a metapage.

Figure 7:
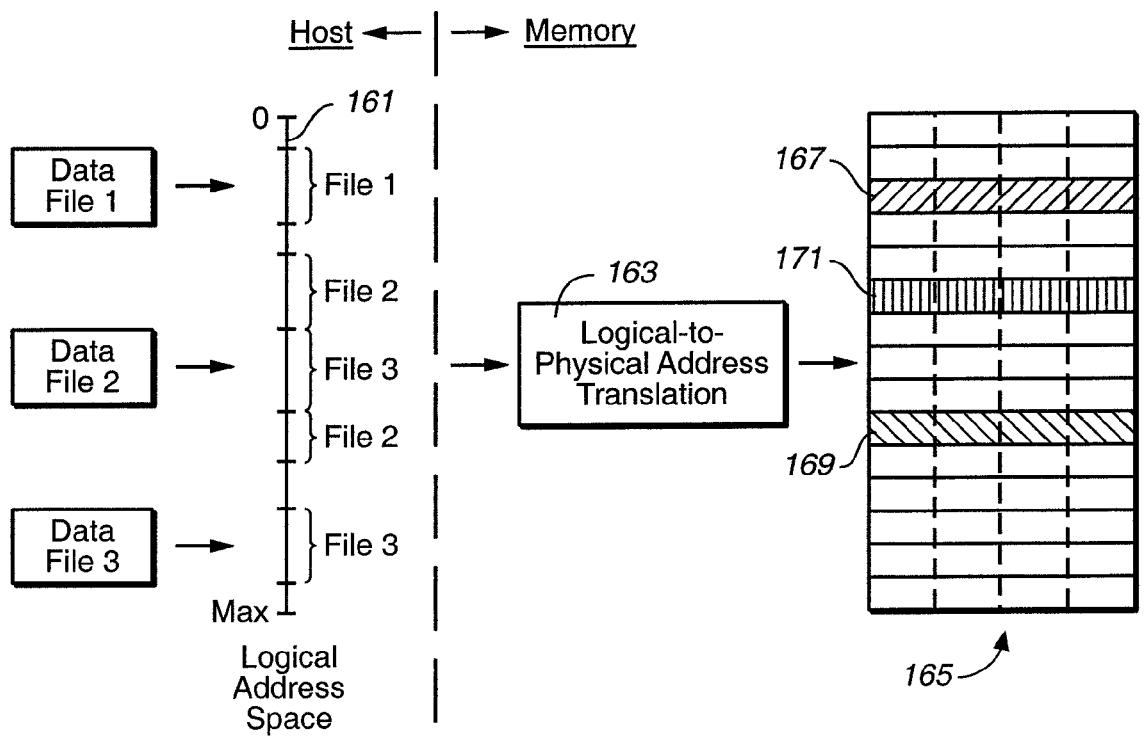
FIG. 7 illustrates a common prior art logical address interface between a host and a re-programmable memory system.

The physically small re-programmable non-volatile memory cards and flash drives identified above are commercially available with data storage capacity of 512 megabytes (MB), 1 gigabyte (GB), 2 GB and 4 GB, and may go higher. FIG. 7 illustrates the most common interface between a host and such a mass memory system. The host deals with data files generated or used by application software or firmware programs executed by the host. A word processing data file is an example, and a drawing file of computer aided design (CAD) software is another, found mainly in general computer hosts such as PCs, laptop computers and the like. A document in the pdf format is also such a file. A still digital video camera generates a data file for each picture that is stored on a memory card. A cellular telephone utilizes data from files on an internal memory card, such as a telephone directory. A PDA stores and uses several different files, such as an address file, a calendar file, and the like. In any such application, the memory card may also contain software that operates the host.

Memory systems, especially memory systems embodied in removable cards, may communicate with different hosts via a standard interface. Different hosts may use different interfaces for communication with memory systems. Two categories of interfaces are those using a logical addressing system with a common logical address space and those using a file based addressing system.

LBA Interface

A common logical interface between the host and the memory system is illustrated in FIG. 7. A continuous logical address space 161 is large enough to provide addresses for all the data that may be stored in the memory system. The host address space is typically divided into increments of clusters of data. Each cluster may be designed in a given host system to contain a number of sectors of data, somewhere between 4 and 64 sectors being typical. A standard sector contains 512 bytes of data.

Three Files 1, 2 and 3 are shown in the example of FIG. 7 to have been created. An application program running on the host system creates each file as an ordered set of data and identifies it by a unique name or other reference. Enough available logical address space not already allocated to other files is assigned by the host to File 1. File 1 is shown to have been assigned a contiguous range of available logical addresses. Ranges of addresses are also commonly allocated for specific purposes, such as a particular range for the host operating software, which are then avoided for storing data even if these addresses have not been utilized at the time the host is assigning logical addresses to the data.

When a File 2 is later created by the host, the host similarly assigns two different ranges of contiguous addresses within the logical address space 161, as shown in FIG. 7. A file need not be assigned contiguous logical addresses but rather can be fragments of addresses in between address ranges already allocated to other files. This example then shows that yet another File 3 created by the host is allocated other portions of the host address space not previously allocated to the Files 1 and 2 and other data. File 1, File 2 and File 3 are all assigned to portions of a common logical address space (logical address space 161) in this example.

The host keeps track of the memory logical address space by maintaining a file allocation table (FAT), where the logical addresses the host assigns to the various host files are maintained. The FAT table is typically stored in the non-volatile memory, as well as in a host memory, and is frequently updated by the host as new files are stored, other files deleted, files modified and the like. When a host file is deleted, for example, the host then deallocates the logical addresses previously allocated to the deleted file by updating the FAT table to show that they are now available for use with other data files. A logical address used in the FAT may be referred to as a Logical Block Address (LBA), so an interface using such logical addressing over a logical address space that is common to data from different files may be referred to as an LBA interface. Similarly, a protocol for communication that uses logical addresses for data being transferred may be considered an LBA protocol.

The host is not concerned about the physical locations where the memory system controller chooses to store the files. The typical host only knows its logical address space and the logical addresses that it has allocated to its various files. The memory system, on the other hand, through a typical host/card interface, only knows the portions of the logical address space to which data have been written but does not know the logical addresses allocated to specific host files, or even the number of host files. The memory system controller converts the logical addresses provided by the host for the storage or retrieval of data into unique physical addresses within the flash memory cell array where host data are stored. A block 163 represents a working table of these logical-to-physical address conversions, which is maintained by the memory system controller.

The memory system controller is programmed to store data files within the blocks and metablocks of a memory array 165 in a manner to maintain the performance of the system at a high level. Four planes or sub-arrays are used in this illustration. Data are preferably programmed and read with the maximum degree of parallelism that the system allows, across an entire metablock formed of a block from each of the planes. At least one metablock 167 is usually allocated as a reserved block for storing operating firmware and data used by the memory controller. Another metablock 169, or multiple metablocks, may be allocated for storage of host operating software, the host FAT table and the like. Most of the physical storage space remains for the storage of data files. The memory controller does not know, however, how the data received has been allocated by the host among its various file objects. All the memory controller typically knows from interacting with the host is that data written by the host to specific logical addresses are stored in corresponding physical addresses as maintained by the controller's logical-to-physical address table 163.

In a typical memory system, a few more blocks of storage capacity are provided than are necessary to store the amount of data within the address space 161. One or more of these extra blocks may be provided as redundant blocks for substitution for other blocks that may become defective during the lifetime of the memory. The logical grouping of blocks contained within individual metablocks may usually be changed for various reasons, including the substitution of a redundant block for a defective block originally assigned to the metablock. One or more additional blocks, such as metablock 171, are typically maintained in an erased block pool. When the host writes data to the memory system, the controller converts the logical addresses assigned by the host to physical addresses within a metablock in the erased block pool. Other metablocks not being used to store data within the logical address space 161 are then erased and designated as erased pool blocks for use during a subsequent data write operation.

Data stored at specific host logical addresses are frequently overwritten by new data as the original stored data become obsolete. The memory system controller, in response, writes the new data in an erased block and then changes the logical-to-physical address table for those logical addresses to identify the new physical block to which the data at those logical addresses are stored. The blocks containing the original data at those logical addresses are then erased and made available for the storage of new data. Such erasure often must take place before a current data write operation may be completed if there is not enough storage capacity in the pre-erased blocks from the erase block pool at the start of writing. This can adversely impact the system data programming speed. The memory controller typically learns that data at a given logical address has been rendered obsolete by the host only when the host writes new data to their same logical address. Many blocks of the memory can therefore be storing such invalid data for a time.

The sizes of blocks and metablocks are increasing in order to efficiently use the area of the integrated circuit memory chip. This results in a large proportion of individual data writes storing an amount of data that is less than the storage capacity of a metablock, and in many cases even less than that of a block. Since the memory system controller normally directs new data to an erased pool metablock, this can result in portions of metablocks going unfilled. If the new data are updates of some data stored in another metablock, remaining valid metapages of data from that other metablock having logical addresses contiguous with those of the new data metapages are also desirably copied in logical address order into the new metablock. The old metablock may retain other valid data metapages. This results over time in data of certain metapages of an individual metablock being rendered obsolete and invalid, and replaced by new data with the same logical address being written to a different metablock.

In order to maintain enough physical memory space to store data over the entire logical address space 161, such data are periodically compacted or consolidated (garbage collection). It is also desirable to maintain sectors of data within the metablocks in the same order as their logical addresses as much as practical, since this makes reading data in contiguous logical addresses more efficient. So data compaction and garbage collection are typically performed with this additional goal. Some aspects of managing a memory when receiving partial block data updates and the use of metablocks are described in U.S. Pat. No. 6,763,424.

Data compaction typically involves reading all valid data metapages from a metablock and writing them to a new block, ignoring metapages with invalid data in the process. The metapages with valid data are also preferably arranged with a physical address order that matches the logical address order of the data stored in them. The number of metapages occupied in the new metablock will be less than those occupied in the old metablock since the metapages containing invalid data are not copied to the new metablock. The old block is then erased and made available to store new data. The additional metapages of capacity gained by the consolidation can then be used to store other data.

During garbage collection, metapages of valid data with contiguous or near contiguous logical addresses are gathered from two or more metablocks and re-written into another metablock, usually one in the erased block pool. When all valid data metapages are copied from the original two or more metablocks, they may be erased for future use.

Data consolidation and garbage collection take time and can affect the performance of the memory system, particularly if data consolidation or garbage collection needs to take place before a command from the host can be executed. Such operations are normally scheduled by the memory system controller to take place in the background as much as possible but the need to perform these operations can cause the controller to have to give the host a busy status signal until such an operation is completed. An example of where execution of a host command can be delayed is where there are not enough pre-erased metablocks in the erased block pool to store all the data that the host wants to write into the memory and data consolidation or garbage collection is needed first to clear one or more metablocks of valid data, which can then be erased. Attention has therefore been directed to managing control of the memory in order to minimize such disruptions. Many such techniques are described in the following U.S. patent applications Ser. No. 10/749,831, filed Dec. 30, 2003, entitled "Management of Non-Volatile Memory Systems Having Large Erase Blocks"; Ser. No. 10/750,155, filed Dec. 30, 2003, entitled "Non-Volatile Memory and Method with Block Management System"; Ser. No. 10/917,888, filed Aug. 13, 2004, entitled "Non-Volatile Memory and Method with Memory Planes Alignment"; Ser. No. 10/917,867, filed Aug. 13, 2004; Ser. No. 10/917,889, filed Aug. 13, 2004, entitled "Non-Volatile Memory and Method with Phased Program Failure Handling"; and Ser. No. 10/917,725, filed Aug. 13, 2004, entitled "Non-Volatile Memory and Method with Control Data Management," (hereinafter collectively referred to as "LBA Patent Applications").

One challenge to efficiently controlling operation of memory arrays with very large erase blocks is to match and align the number of data sectors being stored during a given write operation with the capacity and boundaries of blocks of memory. One approach is to configure a metablock used to store new data from the host with less than a maximum number of blocks, as necessary to store a quantity of data less than an amount that fills an entire metablock. The use of adaptive metablocks is described in U.S. patent application Ser. No. 10/749,189, filed Dec. 30, 2003, entitled "Adaptive Metablocks." The fitting of boundaries between blocks of data and physical boundaries between metablocks is described in U.S. patent applications Ser. No. 10/841,118, filed May 7, 2004, and Ser. No. 11/016,271, filed Dec. 16, 2004, entitled "Data Run Programming."

The memory controller may also use data from the FAT table, which is stored by the host in the non-volatile memory, to more efficiently operate the memory system. One such use is to learn when data has been identified by the host to be obsolete by deallocating their logical addresses. Knowing this allows the memory controller to schedule erasure of the blocks containing such invalid data before it would normally learn of it by the host writing new data to those logical addresses. This is described in U.S. patent application Ser. No. 10/897,049, filed Jul. 21, 2004, entitled "Method and Apparatus for Maintaining Data on Non-Volatile Memory Systems." Other techniques include monitoring host patterns of writing new data to the memory in order to deduce whether a given write operation is a single file, or, if multiple files, where the boundaries between the files lie. U.S. patent application Ser. No. 11/022,369, filed Dec. 23, 2004, entitled "FAT Analysis for Optimized Sequential Cluster Management," describes the use of techniques of this type.

To operate the memory system efficiently, it is desirable for the controller to know as much about the logical addresses assigned by the host to data of its individual files as it can. Data files can then be stored by the controller within a single metablock or group of metablocks, rather than being scattered among a larger number of metablocks when file boundaries are not known. The result is that the number and complexity of data consolidation and garbage collection operations are reduced. The performance of the memory system improves as a result. But it is difficult for the memory controller to know much about the host data file structure when the host/memory interface includes the logical address space 161 (FIG. 7), as described above.

Referring to FIG. 8, the typical logical address host/memory interface as already shown in FIG. 7 is illustrated differently. The host generated data files are allocated logical addresses by the host. The memory system then sees these logical addresses and maps them into physical addresses of blocks of memory cells where the data are actually stored.

File Interface

A file-based interface between a host and memory system for the storage of mass amounts of data eliminates use of the logical address space. The host instead logically addresses each file by a unique fileID (or other unique reference) and offset addresses of units of data (such as bytes) within the file. This file address is given directly to the memory system controller, which then keeps its own table of where the data of each host file are physically stored. This new interface can be implemented with the same memory system as described above with respect to FIGS. 2-6. The primary difference with what is described in FIGS. 2-6 is the manner in which that memory system communicates with a host system.

Figure 9:
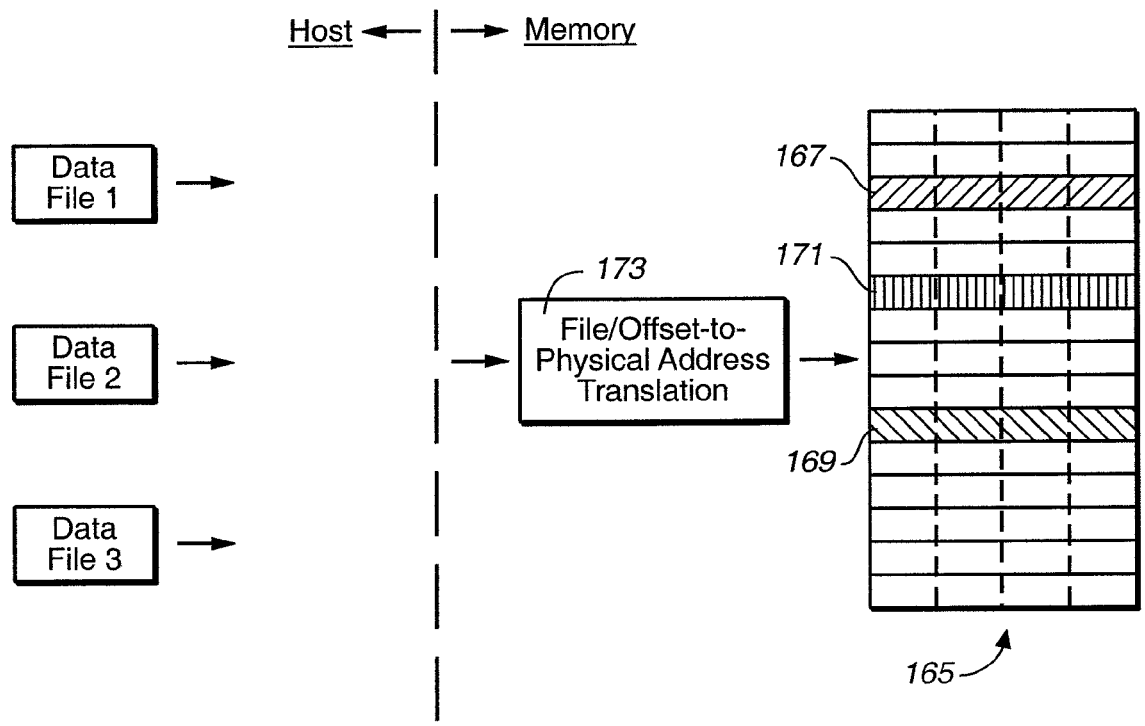
FIG. 9 illustrates a direct file storage interface between a host and a re-programmable memory system, according to the present invention.

A file interface is illustrated in FIG. 9, which should be compared with the LBA interface of FIG. 7. An identification of each of the Files 1, 2 and 3 and offsets of data within the files of FIG. 9 are passed directly to the memory controller. This logical address information is then translated by a memory controller function 173 into physical addresses of metablocks and metapages of the memory 165.

Figure 10:
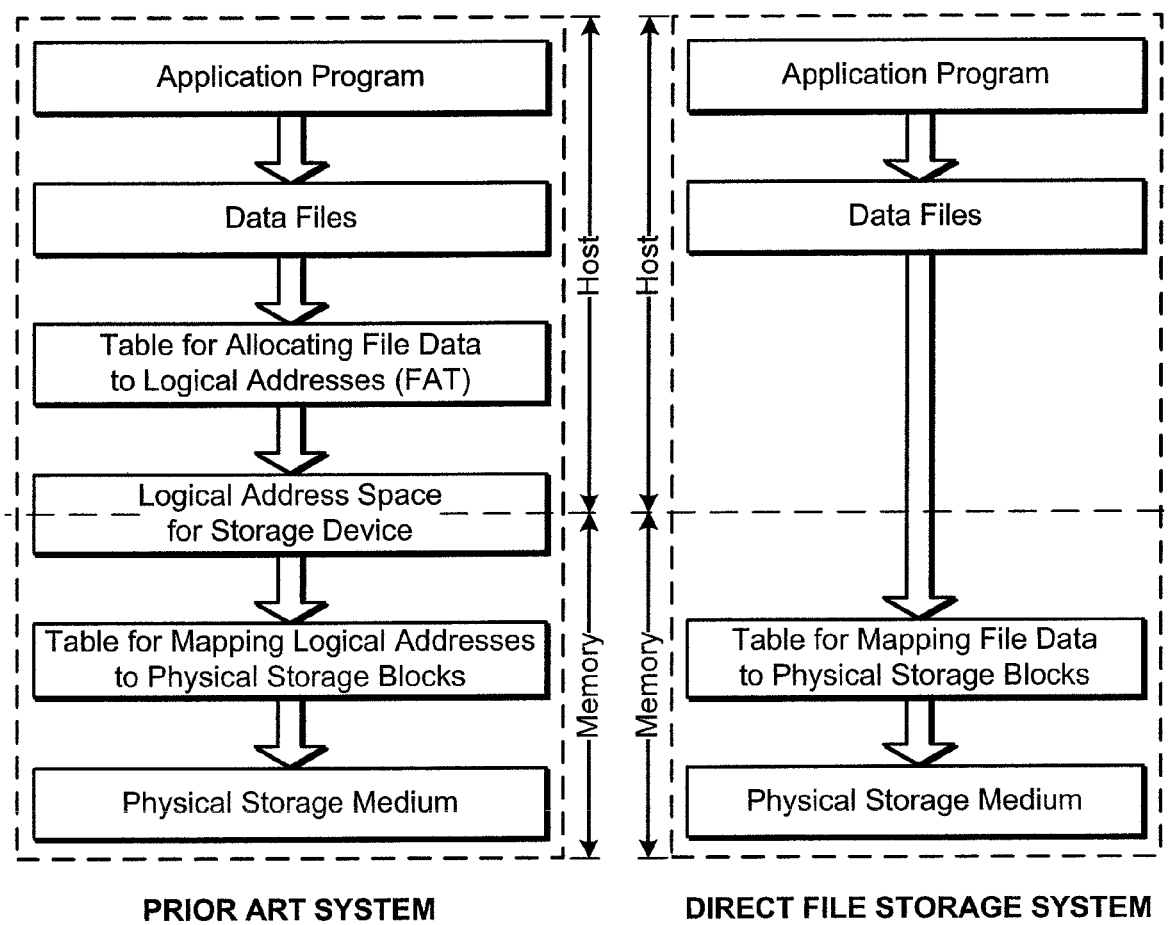
FIG. 10 illustrates in a different manner than FIG. 9 a direct file storage interface between a host and a re-programmable memory system, according to the present invention.

The file interface is also illustrated by FIG. 10, which should be compared with the logical address interface of FIG. 8. The logical address space and host maintained FAT table of FIG. 8 are not present in FIG. 10. Rather, data files generated by the host are identified to the memory system by file number and offsets of data within the file. The memory system then directly maps the files to the physical blocks of the memory cell array.

Since the memory system knows the locations of data making up each file, these data may be erased soon after a host deletes the file. This is not possible with a typical logical address interface. Further, by identifying host data by files instead of using logical addresses, the memory system controller can store the data in a manner that reduces the need for frequent data consolidation and garbage collection. The frequency of data copy operations and the amount of data copied are thus significantly reduced, thereby increasing the data programming and reading performance of the memory system.

Examples of file based interfaces include those using direct data file storage. Direct data file storage memory systems are described in pending U.S. patent application Ser. Nos. 11/060,174, 11/060,248 and 11/060,249, all filed on Feb. 16, 2005 naming either Alan W. Sinclair alone or with Peter J. Smith, and provisional application 60/705,388 filed by Alan W. Sinclair and Barry Wright, and entitled "Direct Data File Storage in Flash Memories" (hereinafter collectively referenced as the "Direct Data File Storage Applications").

Since the direct data file interface of these Direct Data File Storage Applications, as illustrated by FIGS. 9 and 10, is simpler than the logical address space interface described above, as illustrated by FIGS. 7 and 8, and allows the memory system to perform better, the direct data file storage is preferred for many applications. But host systems are primarily configured at the present time to operate with an LBA interface, so a memory system with a direct data file interface is not compatible with most hosts. It is therefore desirable to provide the memory system with the ability to operate with either interface.

Dual Interface

For some memory systems, particularly those that are contained in removable memory cards that can interface with different hosts, backward compatibility is an important concern. Many host systems use a form of sector-based storage similar to that shown in FIGS. 7 and 8 and some of these host systems may not be easily adapted to operate with file-based storage such as shown in FIGS. 9 and 10. Therefore, it is desirable to have memory systems that can interface with hosts using either a logically addressed interface or a file-based interface. An LBA protocol adapter interposed between an LBA interface and a file based backend may allow a host using logical addressing to store data in a memory array that manages data as files.

Figure 11:
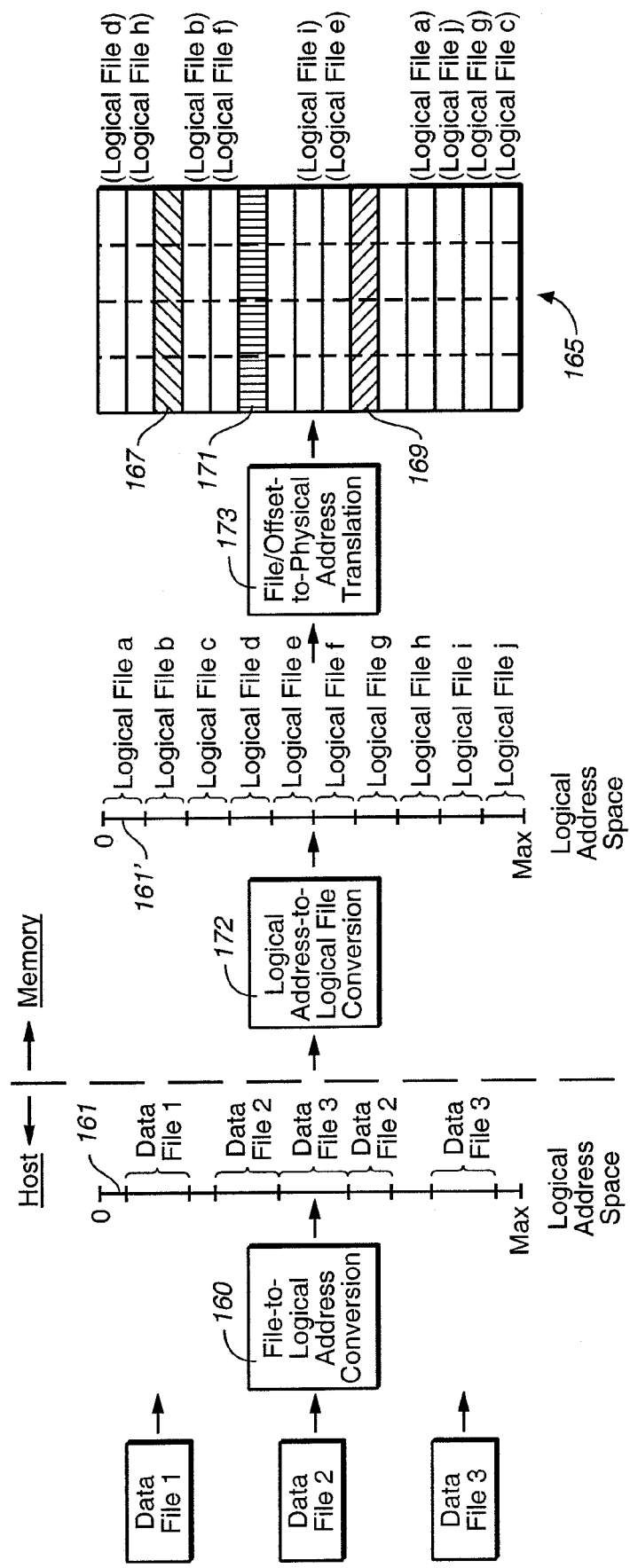
FIG. 11 shows a scheme for storing host files that are received from a host as sectors having logical addresses from a common logical address space defined for the memory, the sectors mapped to logical files and the logical files then stored in the memory array with one logical file per metablock.

U.S. patent application Ser. No. 11/196,869, filed on Aug. 3, 2005, entitled "Interfacing systems operating through a logical address space and on a direct data file basis" describes systems that enable a memory system to interface with hosts using either a logically addressed interface or a file-based interface. FIG. 11 illustrates such a system. This example combines the host operation of FIG. 7 with the file based memory operation of FIG. 9 plus an added address conversion 172 within the memory system. The address conversion 172 maps groups of logical addresses across the memory space 161 into individual logical files a-j shown across the modified address space 161'. The entire logical address space 161 is preferably divided into these logical files, so the number of logical files depends upon the size of the logical address space and of the individual logical files. Each of the logical files contains data of a group of contiguous logical addresses across the space 161. The amount of data within each of the logical files is preferably made to be the same, and that amount equal to the data storage capacity of one metablock in the memory 165. Unequal sizes of the logical files and/or sizes different from the storage capacity of a block or metablock of the memory are certainly possible but not preferred.

Data within each of the individual files a-j are represented by logical offset addresses within the files. The file identifier and data offsets of the logical files are converted at 173 into physical addresses within the memory 165. The logical files a-j are stored directly in the memory 165 by the same processes and protocols described in the Direct Data File Storage Applications. The process is the same as that used to store data files 1-3 of FIG. 9 in the memory 165, except that the known amount of data in each logical file can make this easier, especially if that amount is equal to the capacity of a block or metablock of the memory. It is shown in FIG. 11 that each of the logical files a-j is mapped to a different one of the metablocks of the memory 165. It is also desirable that the file based data storage interact with the host in the same or an equivalent manner as present logical address memory systems with which the host has been designed to interface. By mapping individual logical files into corresponding individual memory metablocks, essentially the same performance and timing characteristics are achieved with the direct data file interface memory system as when a logical address space interface is used.

Figure 12:
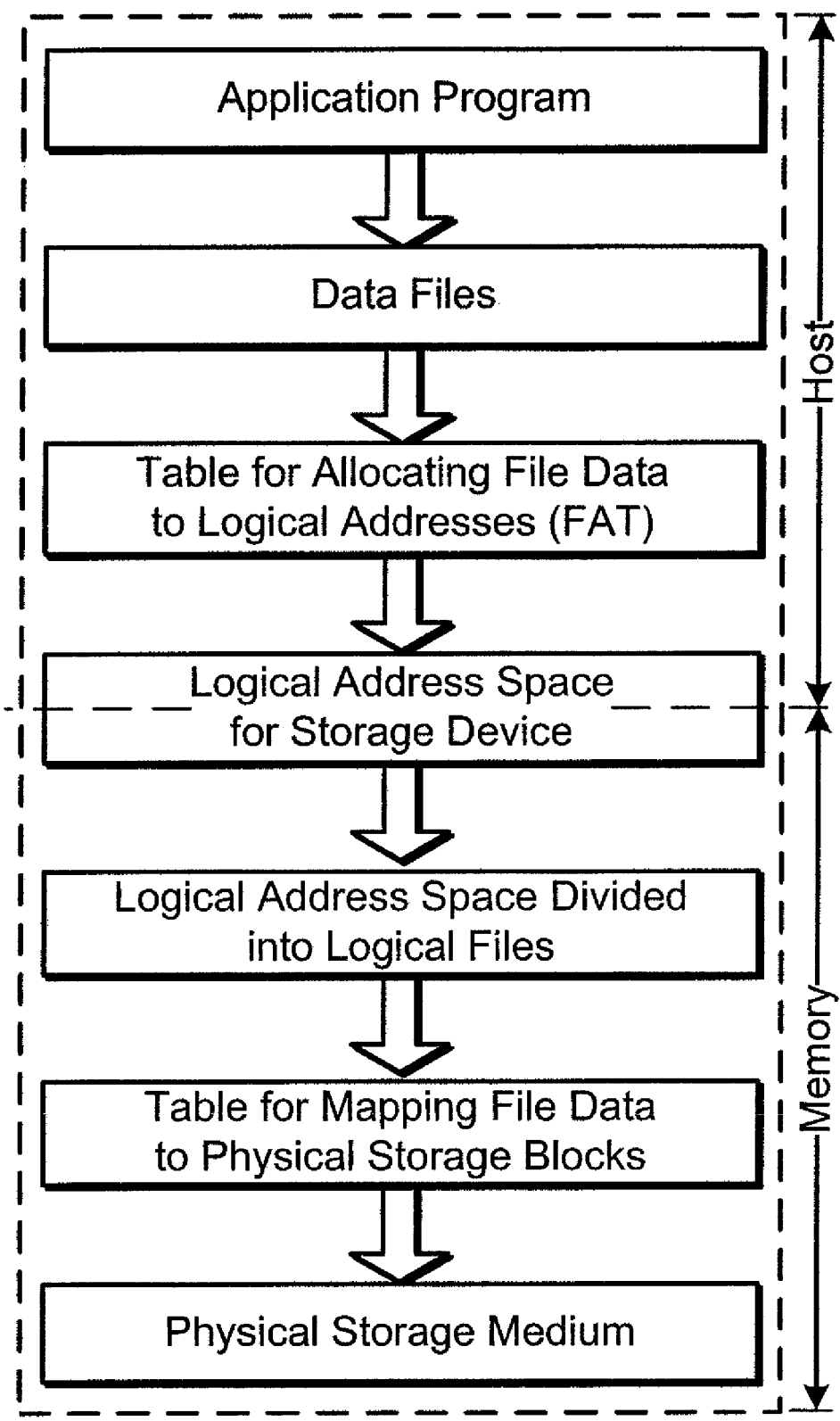
FIG. 12 illustrates in a different matter than FIG. 11 a scheme for storing logically addressed data in a memory array in logical files.

FIG. 12 illustrates the method of FIG. 11 in a different way. FIG. 12 is the same as the logical address memory system operation of FIG. 8 but with the added function of dividing the logical address space into logical files, the step 172 of FIG. 11 just described. Additionally, the "Table for Mapping File Data to Physical Storage Blocks" of FIG. 12 replaces the "Table for Mapping Logical Addresses to Physical Storage Blocks" of FIG. 8. Logical address-to-logical file conversion 172 may be considered part of an LBA protocol adapter that lies between an interface using an LBA system and a backend that is file based.

The data file based backend storage system of FIGS. 11-12, designed to work through a traditional logical address space interface with a host, can also have a direct data file interface added. Both host data files from the file interface and logical files from the logical interface are translated into memory metablock addresses. The data are then stored in those addresses of the memory by executing a direct data file protocol. This protocol includes the direct data file storage techniques of the Direct Data File Storage Applications previously listed.

By providing a portable memory card or flash drive, or other form of removable memory system, with both types of host interface, the memory may be used with most current hosts that operate with a logical address space interface, with a host that directly interfaces its files to the memory, or may be exchanged between both types of hosts. This allows a user of a host with the newer file based interface to use the memory in its most efficient manner but at the same time having a backward compatibility to the traditional logical address space interface. Also, essentially the same performance and timing characteristics are achieved as a result of the same one-to-one logical file to metablock mapping. A memory with dual host interfaces allows it to be acquired by a user for its newer direct data file interface while still being useful with the extensive installed base of hosts having the traditional logical address space interface. It provides a way to migrate from the current interface to the direct data file interface.

Figure 13:
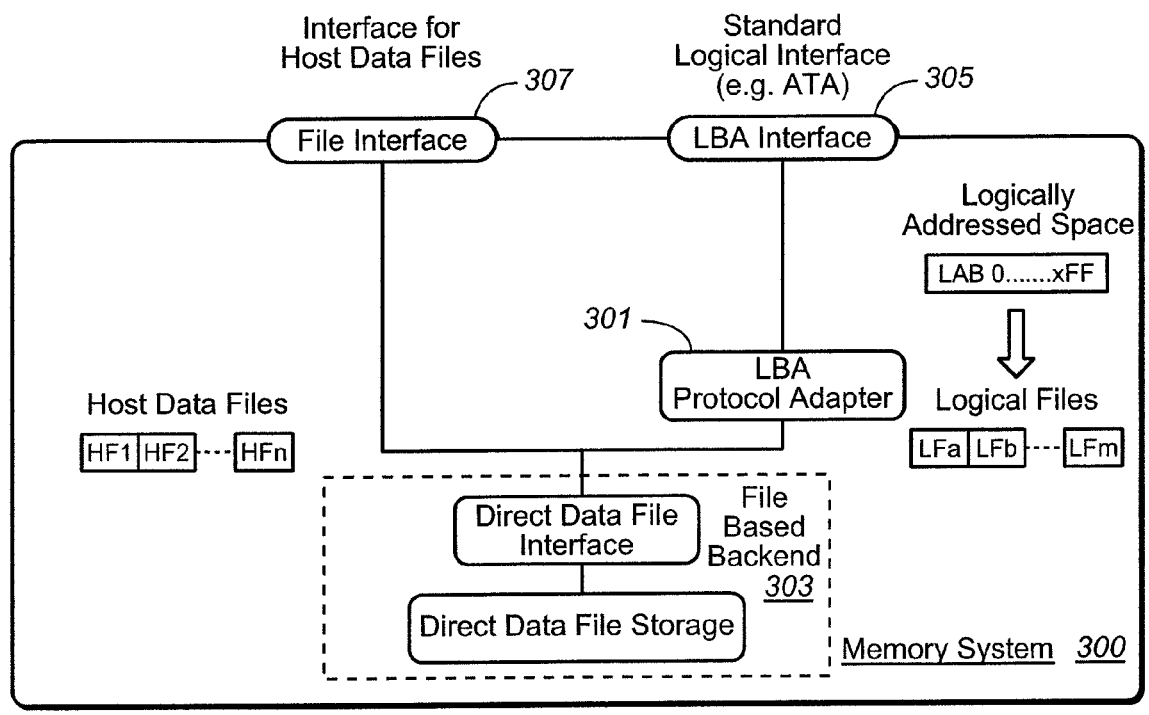
FIG. 13 shows a memory system having both a file interface and an LBA interface in communication with a file based backend, with an LBA protocol adapter interposed between the LBA interface and the file based backend.

FIG. 13 illustrates memory system 300 having a dual host interface. The memory system stores both host data files (HF1, HF2 . . . HFn) supplied directly by the host through file interface 307 and logical files (LFa, LFb . . . LFm) converted by LBA protocol adapter 301 from the LBA interface 305. File based backend 303 does not need to distinguish logical files from host files but rather is preferably optimized to handle files of both. As such, the logical files are equivalent to the logical groups of the systems described in the LBA Patent Applications, and the performance of memory system 300, as viewed from the host interface, therefore matches that of a system with a logical address space interface as described in the LBA Patent Applications.

In addition to converting host data from a logically addressed format to a logical file format, LBA protocol adapter 301 may generate commands that are compatible with file based backend 303 in response to particular conditions or particular LBA commands received from the host. Examples of generating commands for a Direct Data File backend in response to such conditions are shown in the following table.

| Condition | Direct Data File Commands Generated |
| --- | --- |
| Start of LBA command | Write_pointer <fileID> <offset> This command sets up the offset address within the current file, at which the next Write command will operate. |
| Current file is not open AND Open_files = maximum | Close <fileID> + Idle + Pause <until_not_busy> This group of commands closes the least recently accessed file, and causes the device to perform all pending garbage collection operations on the file. |
| Current file is not open | Open <fileID> + Write_pointer <fileID> <offset> This group of commands opens the current file, and sets up the offset address at which the next Write command will act |
| Current file has changed | Write <fileID> + Stream + Write_pointer <fileID> <offset> This group of commands writes accumulated data for the previous file, and sets up the offset address within the current file, at which the next Write command will operate. |
| Program block is full | Write <fileID> + Stream This group of commands writes accumulated data for the current file. |
| Program block is full AND Valid_pages > minimum | Close <fileID> + Idle + Pause <until_not_busy> This group of commands closes the current file, and causes the device to perform all pending garbage collection operations on the file. |
| End of LBA command | Write <fileID> + Stream + Save_buffer <fileID> This group of commands writes accumulated data for the current file, and causes unprogrammed data remaining in the buffer to be programmed to the "swap block" in flash. |

Object Interface

Various file based interfaces may be used to transfer data between electronic devices. Some protocols provide a file that has a predetermined size along with an indication of the size. The size of the file generally remains unchanged in such a system, so that such a system may not be suitable for applications where editing of files is required. However, for transferring files from one device to another, such protocols may be advantageous and may allow a high level of security. The indication of the size is generally sent before the file data are sent. A protocol that transfers files of predetermined size with an indicator of file size may be considered an object protocol. One object protocol is Picture Transfer Protocol (PTP) by Microsoft Corporation. Another such protocol is Media Transfer Protocol, also known as Media Transport Protocol (MTP), also by Microsoft Corporation. An object protocol is particularly suited to sending files that contain a predetermined amount of data such as a digital photograph or an MP3 music file. For example, such protocols may be used to transfer digital photographs between a digital camera and a PC or to transfer MP3 music files from a PC to an MP3 player.

Media Transfer Protocol (MTP) provides an object interface which supports transfer of file objects of predefined size. Its primary purpose is to allow communication between devices that can be temporarily connected together, where each has significant storage capacity. The interface allows the exchange of binary data objects between the devices, and the enumeration of the contents of one device by the other. Certain characteristics of the MTP interface are listed below. However, other object interfaces may have different characteristics. A more complete description of MTP is provided in the document entitled "Media Transfer Protocol Enhanced" from Microsoft Corporation.

1. Communication Protocol 1.1 Initiator & Responder: Exchanges only occur between two devices at a time, with one device acting as the initiator and the other as the responder. The initiator is the device that initiates actions with the responder by sending operations. The responder does not initiate any actions, and sends responses to operations sent by the initiator. A device acting as initiator should be able to enumerate and understand the contents of the responding device, and control the flow of operations in the protocol. The initiator is generally a more powerful device than the responder. Examples of responders are simple content-production devices, such as digital cameras, and simple content-output devices, such as portable audio players.

1.2 Sessions: A session is a communications state in which a connection is maintained between initiator and responder. A session provides a context in which to reference objects, and guarantees that the responder device state does not change without the initiator being alerted. A session is opened by the initiator, and is closed by either the initiator or responder. A device may maintain multiple open sessions concurrently. The initiator assigns a unique identifier to a session when it is first opened, and uses it to identify the session when sending operations.

1.3 Transactions: Any action arising from an initiator is performed in a transaction, a standard sequence of phases that provides the mechanism for action invocation with input parameters, binary data exchange, and responses with parameters. Data flow within each phase is unidirectional. During initiation of an operation, data flows only from initiator to responder. During the response to the requested operation, data flows only from the responder to the initiator. During the binary data-exchange phase, data may flow in either direction, but never both. Bi-directional binary data exchange must be performed by multiple operations. The initiator assigns an identifier to each transaction. A defined identifier is assigned to the first operation initiated in a session, and the identifier is incremented by 1 for each successive transaction.

A transaction consists of up to three phases; the operation request phase, the data phase, and the response phase. The operation request phase and response phase share the same identifier, and the optional data phase exists between the two other phases when required.

The operation request phase consists of transmission of an operation request dataset, which identifies the operation being invoked by the initiator, the context (session and transaction) in which it should be executed, and a limited set of parameters.

An optional data phase follows an operation request phase. Its presence is determined by the operation defined in the operation request phase. The data may be transparent datasets defined within the protocol, or may be binary data exchanged for storage on the receiving device. The actual transmission of data in the data phase may involve sending it in a container format, or breaking it apart into packets, as may be required for a specific transport that is in use.

In the response phase, a fixed dataset is transmitted from the responder to the initiator to report information about the preceding transaction, such as success/failure.

1.4 Events: Events are primarily sent by the responder as a way of proactively transmitting information or alerts. Unlike operations, they are not required to be acknowledged or acted upon. Events are required to be communicated asynchronously with data transmission or operation transactions. A transport should define a process by which events may be interleaved with a data stream during a transaction.

1.5 Synchronous and Asynchronous Transactions: All transactions in the communication protocol are synchronous, that is, a new operation cannot be initiated until the previous operation has fully completed. Asynchronous operations can be simulated by separating the operation into an initiation, which begins the operation, and progress monitoring, through events sent by the responder while the operation is executed in the background on the device. If a new operation is attempted whilst an asynchronous operation is processing, the responder responds with a busy failure status and the initiator should try again later.

2. Information Datasets

When collections of data are exchanged, they are collected in a pre-defined structure termed a dataset. Three information datasets exist, which can be accessed by using appropriate operations.

2.1 Device info dataset: The device info dataset provides a description of the device, and is mostly static.

2.2 Object info dataset: The object info dataset provides an overview of the core properties of the object. These core properties include the size of the data component of the object. Properties also include associations, which can be used to associate data objects and describe hierarchical file systems on devices. A file hierarchy on the device may be represented without relying on any path or naming conventions specific to a particular file system. The properties of an object are also retrievable in an object properties dataset.

2.3 Storage info dataset: The storage info dataset describes the storage contained in a device. The description includes both the maximum capacity and the free space remaining to be written, and may include file naming conventions or directory structure conventions in use.

3. Properties 3.1 Device properties: Device properties identify settings or state conditions of the device, and are not linked to any data objects on the device. Device properties may be read-only or read-write. Properties are contained in a device properties description dataset, and may be set or retrieved by using appropriate operations.

3.2 Object Properties: Object properties provide a mechanism for exchanging object-describing metadata separate from the objects themselves. The primary benefit of object properties is to permit the rapid enumeration of large storages, regardless of the file-system. They provide information about objects on the device, and specify the values they can contain. Properties are contained in an object properties dataset, and may be set or retrieved by using appropriate operations.

4. Object Handles

Object handles are identifiers that provide a consistent reference to a logical object on a device, which is unique within a session. There is no special meaning to the value of object handles. A responder creates an array of object handles for objects within the device, in response to an open session operation from an initiator. The object handles are acquired by the initiator by means of a get object handles operation, which causes the responder to send the object handle array to the initiator. When an initiator uses a send object info operation to define an object to be sent, the responder device allocates an object handle and returns in to the initiator in the response phase of the operation. When a session is closed, all object handles are invalidated and must be re-acquired by the initiator. A device may retain the same object handles or may change object handle values for the next session.

5. Object References

Because the object interface is a file system independent protocol, complex linkages may not be formed between objects by embedding file names. An abstract referencing mechanism has been defined to allow arbitrary object referencing. References are unidirectional, and it cannot be determined which objects reference a given object without examining all the references on all the objects in the device. References may be set or retrieved by using appropriate operations. Objects referenced by file handles must be consistent between sessions. References to a deleted object must not incorrectly reference another object. Either object handles should never be reused, or the device should delete all references to an object along with the object.

6. Operations & Responses

An operation defines the communication that occurs between initiator and responder within a transaction. Information required by the responder to act upon an initiated operation may be passed as parameters on the operation request. 5 parameters may be sent. Additional information may also be passed in a pre-defined dataset in the data phase of the transaction. Following every operation, the responder returns a response dataset with up to 5 parameters and a response code indicating the result of the operation. A large number of operations are specified. Examples of sequences of operations are a "send object info" operation followed by a "send object" operation, by which an initiator sends an object to a responder, and a "get object info" operation followed by a "get object" operation, by which an initiator receives an object from a responder.

Figure 14A:
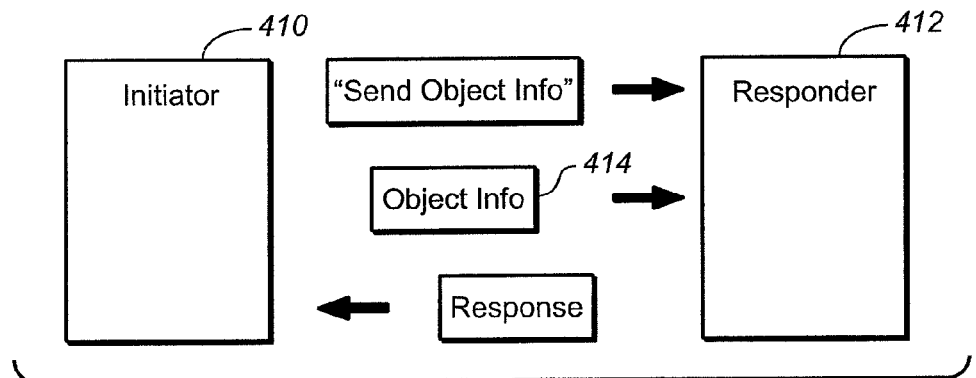
FIG. 14A shows an MTP "send object info" transaction.

FIG. 14A shows an example of a transaction between an initiator 410 and a responder 412. Initiator 410 may be a PC and responder 412 may be an MP3 music player or a digital camera. Initiator 410 and responder 412 are connected to allow communication, for example by a USB cable. Firstly, in the operation request phase, initiator 410 identifies the operation being invoked as a "send object info" operation. Secondly, in the data phase, initiator 410 sends object information 414 to responder 412. Object information 414 is information about the particular object that is about to be sent by initiator 410 to responder 412. Object information 414 is sent by initiator 410 before an object to which it refers is sent. Object information may include a variety of information about an object including the size of the object. Where the object to be sent is an MP3 music file, the size of the MP3 music file is sent as part of the object information. Thirdly, in the response phase (after the object information 414 is received by responder 412), responder 412 indicates that object information 414 has been received. The transaction may end at this point.

Figure 14B:
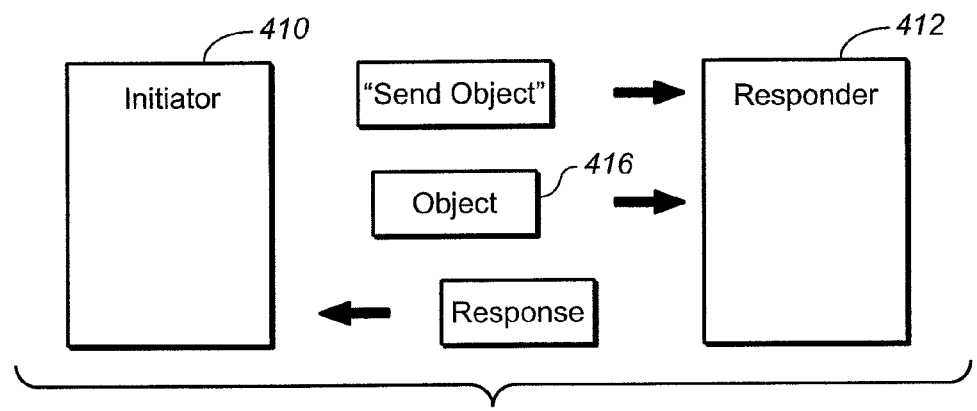
FIG. 14B shows an MTP "send object" transaction.

FIG. 14B shows a second transaction that follows the transaction of FIG. 14A and is part of the same session between initiator 410 and responder 412. The second transaction is a "send object" transaction. Firstly, in the operation request phase, initiator 410 identifies the operation being invoked as a "send object" operation. Secondly, in the data phase, the initiator sends object 416 to responder 412. Object 416 may be an MP3 music file or a digital photo in a file format such as JPEG, GIF or bitmap. Object information 414 (including the file size) for object 416 was already sent by initiator 410 to responder 412 as described with respect to FIG. 14A. Thirdly, in the response phase (after object 416 is received), responder 412 indicates to initiator 410 that object 416 has been received. The transaction may end at this point.

Object Protocol Adapter

In an embodiment of the present invention, an object protocol adaptor is provided in a memory system that allows a host using an object protocol to interface with a memory system that uses a file based backend such as described above. An object protocol adaptor receives data and commands through an object interface according to the object protocol and performs appropriate translation before sending the data and commands to the backend. In one example, the host uses MTP to interface with the memory system and the memory system uses a direct data file backend to store the data. An object protocol adaptor performs appropriate conversion of both commands and data between the host interface and the backend.

Figure 15:
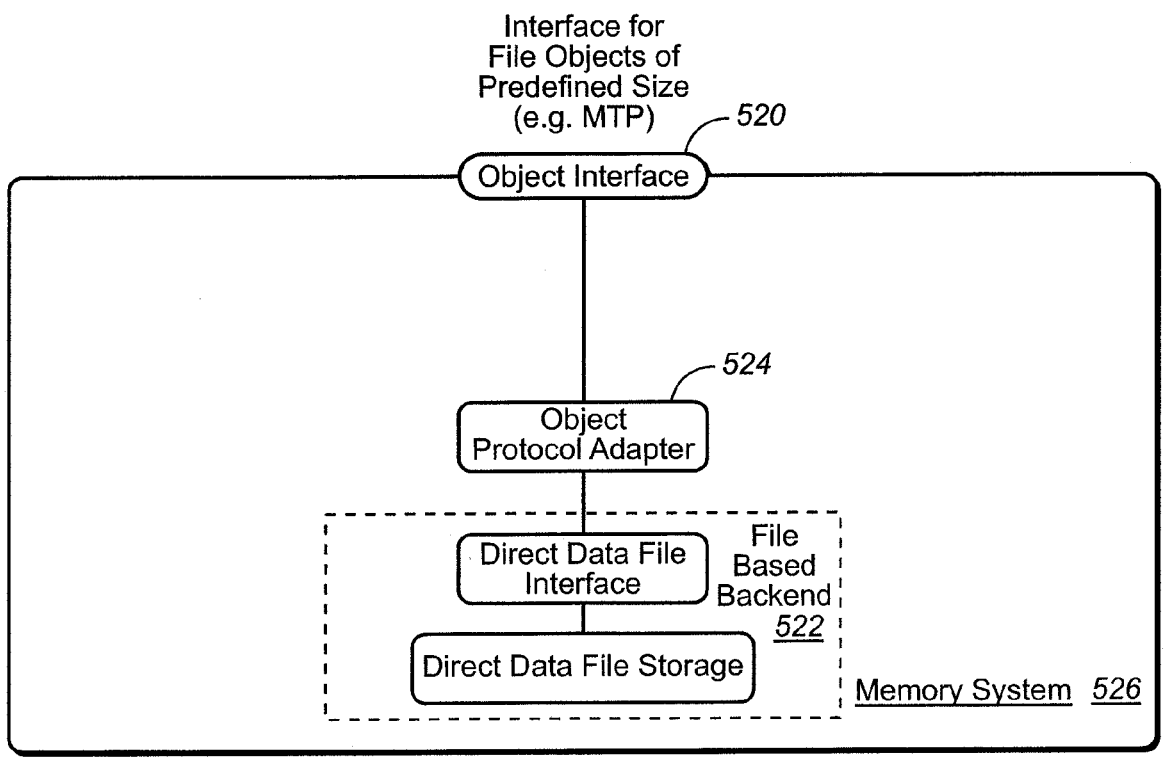
FIG. 15 shows a memory system having an object interface and a file based backend with an object protocol adapter interposed between them.

FIG. 15 shows an example of an object protocol adapter interposed between an object interface 520 and a file based backend 522. Object interface 520 is an interface for file objects of predetermined size, for example MTP or PTP objects. The size of an object is sent before the object is sent by the host. An object protocol adapter 524 manages the protocol within which memory system 526 communicates with the host. Object protocol adapter 524 also manages transactions for information exchange with the host and performs translations. Transactions are performed between the object protocol adapter and the file based backend according to the file based protocol.

Object protocol adapter 524 manages opening and closing of files by sending the appropriate commands to file based backend 522 when a new file object is sent by the host (according to the object protocol). In particular, because a file has a predetermined size in an object protocol, object protocol adapter 524 is responsible for closing the file when the predetermined amount of file data has been received. A host using an object protocol will not generally send a separate end-of-file indicator, so object protocol adapter 524 generates an end-of-file indicator and sent it to file based backend 522 when the entire file object has been received. In this way, when memory system 526 receives multiple files from a host using an object protocol, file based backend 522 does not keep the files open until it reaches some maximum number of open files (as generally happens in a Direct Data File backend). Instead, each file is received as a complete object and the file based backend receives a command from object protocol adapter 524 after the complete file is received so that the file based backend closes the file. This reduces the burden of maintaining many open files. The file may be scheduled for garbage collection once it is closed.

The object protocol adapter may manage the state of the memory system. In particular, for memory systems having a Direct Data File backend, three states are defined that allow the memory system to alter its operation in response to a host command. These three states are: "idle," "standby" and "shutdown." The three states are initiated in response to corresponding state commands from the host where the host uses a Direct Data File command set or equivalent. Where a host uses an object protocol, an object protocol adapter may generate state commands. The object protocol adapter may send state commands to the file based backend in response to equivalent commands received from a host if the host is using an object protocol that includes such commands. Alternatively, an object protocol adapter may generate state commands based on deducing the state of the host from other factors. For example, the host may give some indication that it will not remove power for a period of time and in response the object protocol adapter may send an "idle" state command to the file based backend. Similarly, the host may indicate that it is about to remove power, or the object protocol adapter may deduce that power is about to be removed based on the host's behavior, and in response the object protocol adapter may send a "shut-down" command to the file based backend.

One of the main functions of an object protocol adapter is to convert host data from a predefined file received from the host (according to an object protocol) to streaming data for the file based backend. While a host using an object protocol (acting as an initiator in MTP) sends a file having a predefined size and requires a response from a responder, a file based backend is not generally configured to provide such a response. In particular, where a Direct Data File backend is used, data is generally streamed and there is no equivalent of the response phase of MTP. An object protocol adapter converts the object from the host to streaming data and generates the appropriate response to the host when all the data of the object has been received.

In an object protocol such as MTP, an operation to read or write an object is preceded by a separate operation for transfer of information about the object. Such an information transfer operation is a "set" operation for object properties (object info.) in the case of an object being written. Such an information transfer operation is a "get" operation for object properties in the case of an object being read. The object properties are in the form of a dataset that includes the length of the object.

When an object is being written to memory system 526 of FIG. 15, the dataset for the object is first received by the object protocol adapter 524 from the host. The host is considered to be the initiator in MTP terms. The information in the dataset is used to control the subsequent transaction that implements the write operation. The dataset is also stored in memory system 526 as metadata. During the write operation, object protocol adapter 524 counts the amount of data transferred from the initiator during the data phase of the write operation. Object protocol adapter 524 identifies the end of the object data from this count. The object protocol adapter then generates a response that is sent to the host. Object protocol adapter 524 also sends a command to file based backend 522 to close the file.

When an object is being read from memory system 526 of FIG. 15, the metadata for the object is first obtained by object protocol adapter 524 from file based backend 522. The metadata for the object is then used to control the subsequent transaction that implements the read operation. Object protocol adapter 524 also sends the metadata stored in memory system 526 to the host as a dataset for the object. Object protocol adapter 526 counts the amount of data transferred from file based backend 522 during the data phase of the read operation. Object protocol adapter 524 identifies the end of the data from this count. Object protocol adapter 524 then generates a response that is sent to the host after the object has been sent.

An object protocol adapter translates between object info datasets used in object protocols such as MTP and metadata stored in file based memory systems such as those using a Direct Data File backend. "Metadata" is a term used to refer to data about an object that are stored separately from the object and are managed separately. Thus, an object info dataset in MTP is one example of metadata. A Direct Data File backend may store metadata in a different format or in the same format as used by an object protocol. The term "file_info" is also used for metadata in Direct Data File systems. When object protocol adapter 524 receives a metadata related command from a host, object protocol adapter 524 may translate the command into a format that is compatible with file based backend 522. In some cases however, no translation is needed because the commands used for metadata in the object protocol are compatible with file based backend 522.

Metadata is information generated by a host that is associated with a file. The nature and content of metadata is determined by the host, and it is not generally interpreted by a device that stores the file and metadata. Metadata commands are used to initiate metadata input and output operations for a specified file stored by a Direct Data File backend, and to define offset address values within metadata. Metadata commands may be generated by an object protocol adapter when corresponding commands regarding MTP datasets are received from a host. Examples of metadata commands used by a Direct Data File backend system are shown in the following table.

| Command | Parameters | Description |
| --- | --- | --- |
| Metadata_write | <fileID> | Writes metadata for specified file at offset address defined by current value of metadata_write_pointer |
| Metadata_read | <fileID> | Reads metadata for specified file at offset address defined by current value of metadata_read_pointer |
| Metadata_write_pointer | <fileID><br><offset> | Defines new current value for metadata_write_pointer for specified file |
| Metadata_read_pointer | <fileID><br><offset> | Defines new current value for metadata_read_pointer for specified file |

Metadata_write: Metadata streamed to the device following receipt of the metadata_write command overwrites metadata for the specified file at the offset address defined by the current value of the metadata_write_pointer. The content and length of metadata for the specified file is determined by the host. The metadata_write command is terminated by receipt of any other command.

Metadata_read: Metadata for the specified file at the offset address defined by the current value of the metadata_read_pointer may be streamed from the device following receipt of the metadata_read command. Metadata streaming is terminated when the end of the metadata is reached, and this condition may be identified by the host by means of a status command. The metadata_read command is terminated by receipt of any other command.

Metadata_write_pointer: The metadata_write_pointer command sets the metadata_write_pointer for the specified file to the specified offset address. The metadata_write_pointer is incremented by the device as metadata is streamed to the device following a metadata_write command.

Metadata_read_pointer: The metadata_read_pointer command sets the metadata_read_pointer for the specified file to the specified offset address. The metadata_read_pointer is incremented by the device as metadata is streamed from the device following a metadata_read command.

In some cases, a host may have a hierarchical arrangement of objects. For example, files may be stored in directories and subdirectories. A Direct Data File backend generally stores files without any hierarchical structure (i.e. in a logically flat arrangement). In order to reconcile the two systems, an object protocol adapter can recreate the hierarchical structure of stored objects by using metadata associated with the objects. Where a host maintains a hierarchy, information regarding the status of a file in the hierarchy is stored as metadata when the file is stored. When the memory system is accessed by a host, the metadata may be read first so that the object protocol adapter can determine the hierarchical structure and may return this information to the host. In this way, the object protocol adapter can recreate hierarchy information even though the files are stored in the memory system without regard to this hierarchy information. For example, the directory and subdirectory in which a file is located in the host's hierarchy may be stored as metadata when the file is stored. Later when a host attempts to access the contents of the memory system, the directory and subdirectory information is reflected in the information returned to the host.

Multi-Protocol Interface

In an embodiment of the present invention, a memory system is provided that can receive and store objects that have a predetermined size (such as according to the MTP protocol), files that are received as streamed files without predetermined size and sectors of data with logical addresses defined over a logical address space defined for the memory system. Protocol adapters are configured corresponding to these three protocols and are selected according to the protocol used by a host.

Figure 16:
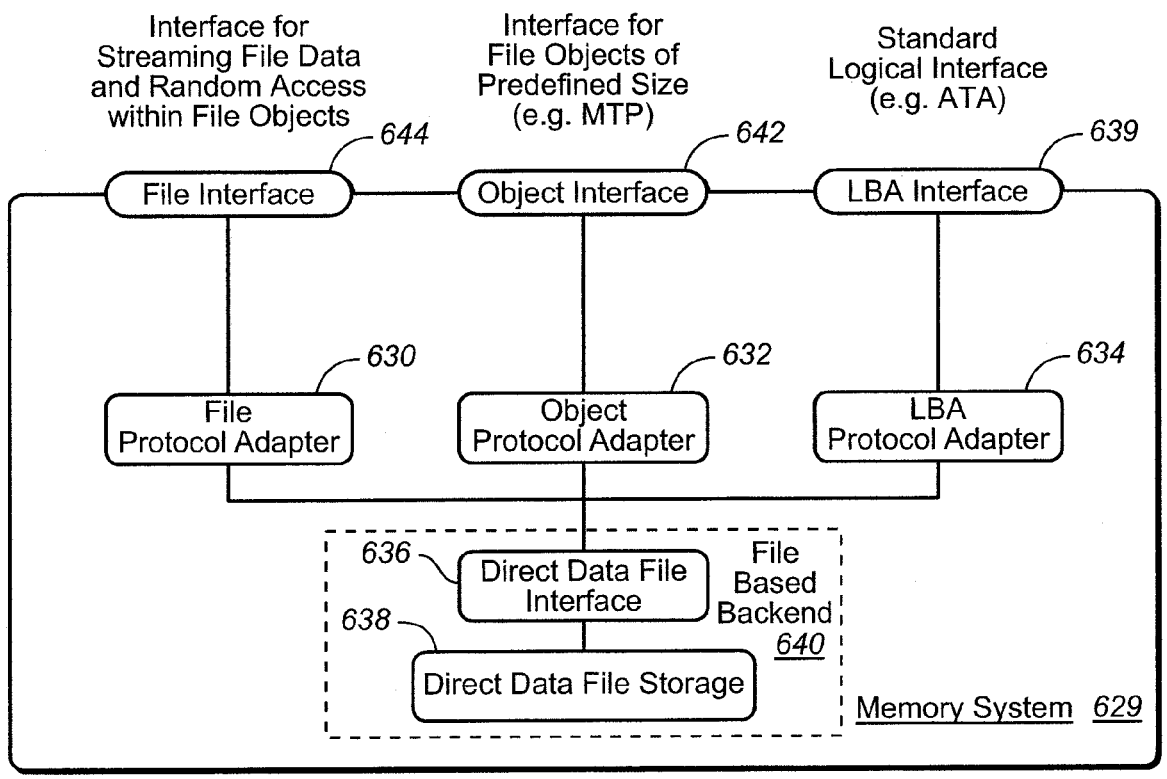
FIG. 16 shows a memory system having a file interface, object interface and LBA interface with a file protocol adaptor, object protocol adapter and LBA protocol adapter to facilitate communication between interfaces and a file based backend.

FIG. 16 shows a memory system 629 having three protocol adapters 632, 632, 634 connected to a common Direct Data File Interface 636. Direct Data File interface 636 and Direct Data File storage 638 are in a file based backend 640, which may be considered a Direct Data File back-end. Thus, memory system 629 uses a common backend for data received from any of the file interfaces. Partitioning of the memory may not be necessary in such a system so that the available space in the memory array is efficiently used. Thus, a block in the array may be used for storage of data received from the file interface, object interface and LBA interface at different times. However, data received from the LBA interface may be stored in blocks that only store data received from the LBA interface at that time. Data received from the file interface and object interface are managed in a way that generally reflects its file structure so that garbage collection is reduced.

FIG. 16 shows an LBA interface 639 connected to the file based backend 640 through LBA protocol adapter 634. LBA protocol adapter 634 may convert LBA data into logical files or use some other way of converting LBA data to a suitable format for receipt by a file based backend.

Object interface 642 is connected to file based backend 640 through object protocol adapter 632. Generally, object protocol adapter 632 converts data and commands from one protocol to another to allow a host using an object protocol to access a file based backend. While this may simply involve a one-to-one translation from an object protocol command to a file based command, in some cases commands do not have an equivalent in the other protocol. In such cases, the object protocol adapter may do more than simple translation. For example, where an MTP host sends metadata including the size of an object and then sends the object, the object protocol adapter recognizes the end of the object and generates a response to the MTP host. The object protocol adapter also generates a close file command to the file based backend at this point.

File interface 644 connects to file based backend 640 through a file protocol adapter 630. In some cases, a host using the appropriate file based protocol may communicate directly with a file based backend without any translations being necessary. However, in other cases a host may send files using a protocol that is file based but is not the same as that of the. file based backend. In such cases file protocol adapter 630 performs any necessary translation.

The memory system of FIG. 16 is compatible with hosts using at least three different protocols. The memory system may also be compatible with other hosts if additional protocol adapters are provided.

Figure 17:
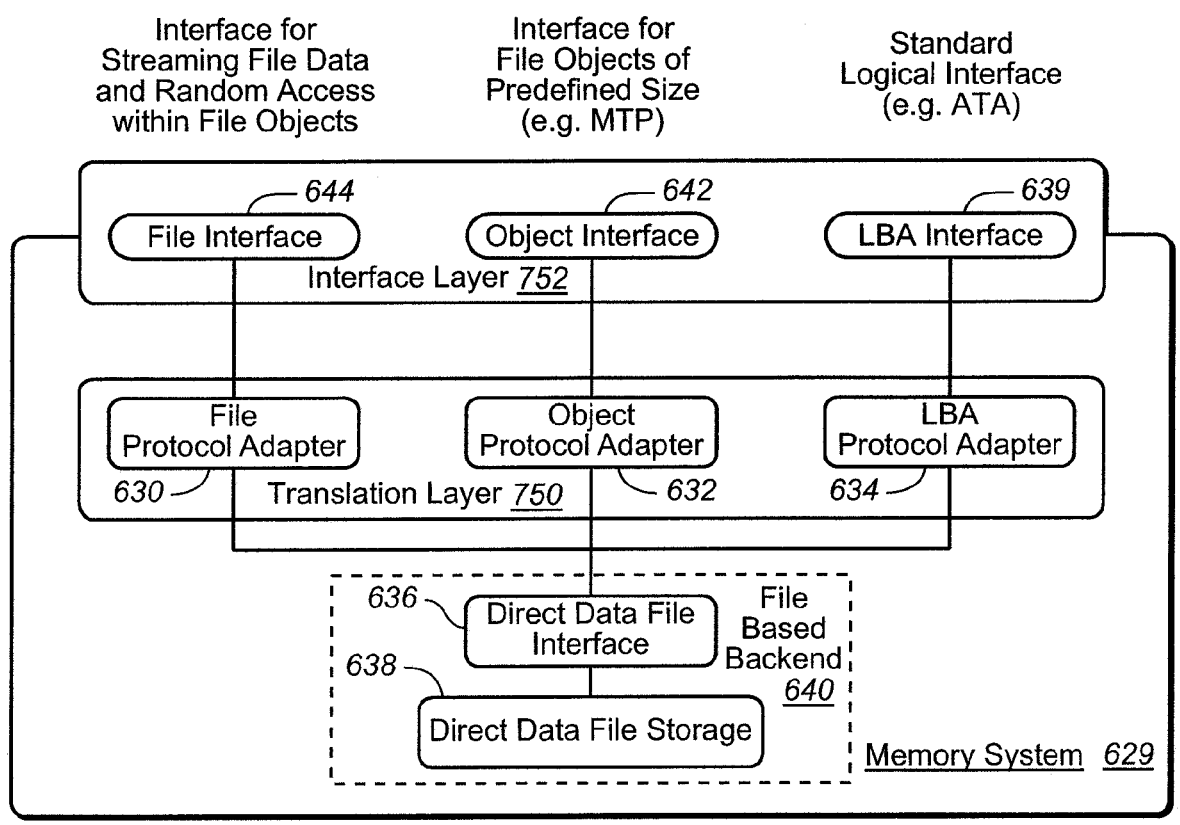
FIG. 17 shows an alternative view of the memory system of FIG. 16 with file interface, object interface and LBA interface considered as part of an interface layer and with file protocol adapter, object protocol adapter and LBA protocol adapter considered as part of a translation layer.

FIG. 17 shows memory system 629 of FIG. 16 with file protocol adapter 630, object protocol adapter 632 and LBA protocol adapter 634 together considered as a translation layer 750. Each protocol adapter provides translation as needed between a particular host protocol and file based backend 640. In some cases, memory system 629 may be in communication with more than one host at a time. For example, memory system 629 may be connected to a network having multiple hosts attached. In other examples, a single host may have different applications running that act as if they were different hosts and may communicate with the memory system using different protocols. In such cases translation layer 750 must resolve any conflicts between different hosts. Translation layer 750 provides arbitration between different hosts so that file based backend 640 does not receive conflicting commands. This may mean denying one host access until another host has completed a particular task. For example, if object protocol adapter 632 is transferring an object or metadata, translation layer 750 may prevent LBA protocol adapter 634 and file protocol adapter 630 from communicating with file based backend 640 until the operation is complete. This may mean sending a busy signal to hosts attempting to access the memory system via LBA interface 639 or file interface 644. In some examples, different hosts may be able to access file based backend 640 through interleaved transactions so that they have access over the same time period. In such cases, translation layer 750 arbitrates between the hosts.

FIG. 17 shows interface layer 752 containing file interface 644, object interface 642 and LBA interface 639. File interface 644, object interface 642 and LBA interface 639 are shown as distinct elements, however this is a logical representation showing the logical interface of memory system 629 and there may not necessarily be three separate physical interfaces. In some examples, a single physical interface (such as a USB connector or SD connector) is common to file interface 644, object interface 642 and LBA interface 639 along with any other interfaces used. Which interface is used, and thus which protocol adapter is used, depends on the protocol used by the host. In some cases, the host protocol may be indicated by the host as part of a hand-shaking routine when the memory system is first connected to the host. In other cases, the host protocol is deduced by memory system 629 from commands sent by the host. Interface layer 752 may detect the host protocol used either from an indication sent by the host or in some other way and selects the appropriate interface for communication according to the host protocol. Thus, where the memory system detects that a host is using the MTP protocol, object interface 642 and object protocol adapter 632 are selected. Generally, only one protocol adapter is selected at any one time. However, in some cases protocol adapters may be alternately selected to allow interleaved access by two or more hosts.

It will be understood that the elements of FIG. 17 correspond to logical components of memory system 629 and do not necessarily correspond to separate physical elements. Thus, the functions of interface layer 752 and translation layer 750 may be achieved by dedicated circuitry or may be achieved using appropriate firmware operating on a controller. In one example, a single physical interface is managed by a memory controller that selects protocol adapters that run on the memory controller to convert data and commands to a format compatible with a common backend. While FIG. 17 shows just three protocol adapters, real memory systems may have more or less than three protocol adapters. In some cases there may be more than one object protocol adapter. For example, there may be an object protocol adapter for MTP and a separate object protocol for another object protocol (e.g. PTP). Similarly, there may be more than one file protocol adapter for different file protocols and different LBA protocol adapters for different LBA protocols. For example, patent application Ser. No. 11/302,764, entitled, "Logically-Addressed File Storage Methods," by Alan W. Sinclair, provides examples of alternative LBA protocols.

Conclusion

Although the various aspects of the present invention have been described with respect to exemplary embodiments thereof, it will be understood that the present invention is entitled to protection within the full scope of the appended claims.

It is claimed:

1. A memory system for storing data in a non-volatile memory array, the memory system receiving data from one or more applications in different logical formats and storing data in the memory array in a common logical format, comprising:
   a first protocol adapter that receives first data from a first application as a first host file preceded by an indication of the length of the first host file and sends the first data to the non-volatile memory array where the first data are stored at a location recorded using a first file identifier;
   a second protocol adapter that receives second data from a second application as a stream of data identified as data of a second host file without an indication of the length of the second host file and sends the second data to the non-volatile memory array where the second data are stored at a location recorded using a second file identifier; and
   a third protocol adapter that receives third data from a third application as a plurality of sectors having individual logical addresses from a logical address range defined for the memory system and sends the third data to the non-volatile memory array where the third data are stored at a location recorded using a third file identifier.

2. The memory system of claim 1 wherein the memory system is contained in a memory card that may be removably connected to host systems by a standardized connection.

3. The memory system of claim 2 wherein the first application runs on a first host system, the memory card connected to the first host system at a first time;
   the second application runs on a second host system, the memory card connected to the second host system at a second time; and
   the third application runs on a third host system, the memory card connected to the third host system at a third time.

4. The memory system of claim 1 wherein the locations of the first, second and third data are recorded with entries indicating one or more blocks in the memory array corresponding to each of the first, second and third file identifiers.

5. The memory system of claim 1 wherein the first protocol adapter generates an indication to the host that the first host file has been received.

6. The memory system of claim 1 wherein the first protocol adapter generates an indicator of the end of the first host file that causes the first data to be scheduled for garbage collection.

7. The memory system of claim 1 wherein the non-volatile memory array consists of a plurality of blocks, a block being a minimum physical unit of erase of the memory array.

8. The memory system of claim 7 wherein the plurality of blocks are grouped into metablocks and all blocks of a metablock are erased together.

9. The memory system of claim 3 further comprising a physical interface, the physical interface connecting the memory system to the first host system at the first time, the physical interface connecting the memory system to the second host system at the second time, and the physical interface connecting the memory system to the third host system at the third time.

10. The memory system of claim 2 wherein the memory card includes a memory controller and the first, second, and third protocol adapters are executed by the memory controller.

11. A memory system comprising: a nonvolatile memory array; a backend memory management system that manages data within the nonvolatile memory array as files; an interface layer that communicates with a host; a translation layer between the interface layer and the backend memory management system, the translation layer receiving host commands from the interface layer, the host commands complying with an object protocol, and in response to receiving the host commands the translation layer generating translated commands to the backend memory management system, the translated commands not complying with the object protocol; and the memory system embodied on a removable memory card that connects to a host interface and that stores data received through the host interface; wherein a host sends metadata including an indication of the size of an object before sending the object and the translation layer determines when the entire object has been received from the host from the indication; in response to determining that the entire object has been received, the translation layer generates a response that is sent to the host and generates an end of file indicator that is sent to the backend memory management system.

12. The memory system of claim 11 wherein the object protocol is Media Transport Protocol (MTP).

13. The memory system of claim 11 wherein the translation layer further includes:
   a file protocol adapter that translates communication from a second host using a host file protocol to the backend file protocol; and
   an LBA protocol adapter that translates communication from a third host using a logical address protocol to the backend file protocol.

14. The memory system of claim 13 wherein the LBA protocol adapter receives sectors of data having logical addresses allocated by the third host from a logical address space defined for the memory system and maps the sectors to virtual files that are equal in size to the capacity of a metablock of the memory array, where a metablock is a unit of erase that consists of an integer number of blocks that are erased together.

15. A memory system for storing data in a non-volatile memory array, the memory system receiving data from one or more applications in different logical formats and storing data in the memory array in a common logical format, comprising:
- a first protocol adapter that receives first data from a first application as a first host file preceded by an indication of the length of the first host file and sends the first data to the non-volatile memory array, where the first data are stored at a location recorded using a first file identifier; and
- a second protocol adapter that receives second data from a second application as a stream of data identified as data of a second host file without a preceding indication of the length of the second host file and sends the second data to the non-volatile memory array, where the second data are stored at a location recorded using a second file identifier.

16. The memory system of claim 15 wherein the memory system is contained in a memory card that may be removably connected to host systems by a standardized connection.

17. The memory system of claim 16 wherein the first application runs on a first host system, the memory card connected to the first host system at a first time; and
- the second application runs on a second host system, the memory card connected to the second host system at a second time.

18. The memory system of claim 15 wherein the locations of the first data and the second data are recorded with entries indicating one or more blocks in the memory array corresponding to each of the first and second file identifiers.

19. The memory system of claim 15 wherein the first protocol adapter generates an indication to the host that the first host file has been received.

20. The memory system of claim 15 wherein the first protocol adapter generates an indicator of the end of the first host file that causes the first data to be scheduled for garbage collection.

* * * * *